United States Patent
Kishino et al.

(10) Patent No.: US 7,772,586 B2
(45) Date of Patent: Aug. 10, 2010

(54) OPTICAL SEMICONDUCTOR DEVICES ON InP SUBSTRATE

(75) Inventors: Katsumi Kishino, Tokyo (JP); Ichiro Nomura, Tokyo (JP); Koshi Tamamura, Tokyo (JP); Hitoshi Nakamura, Hachioji (JP)

(73) Assignees: Sophia School Corporation, Tokyo (JP); Sony Corporation, Tokyo (JP); Hitachi, Ltd., Tokyo (JP)

( * ) Notice: Subject to any disclaimer, the term of this patent is extended or adjusted under 35 U.S.C. 154(b) by 478 days.

(21) Appl. No.: 11/500,292

(22) Filed: Aug. 8, 2006

(65) Prior Publication Data
US 2007/0051937 A1 Mar. 8, 2007

(30) Foreign Application Priority Data
Sep. 5, 2005 (JP) .............................. 2005-256566

(51) Int. Cl.
*H01L 33/00* (2010.01)
(52) U.S. Cl. .......................... 257/13; 257/97; 257/201; 257/E33.021; 257/E33.05
(58) Field of Classification Search .................. 257/13, 257/97
See application file for complete search history.

(56) References Cited

U.S. PATENT DOCUMENTS

| | | | |
|---|---|---|---|
| 6,078,062 A | 6/2000 | Kuramoto et al. | |
| 6,178,190 B1 | 1/2001 | Naniwae et al. | |
| 2004/0155255 A1* | 8/2004 | Yamamoto et al. | 257/102 |

FOREIGN PATENT DOCUMENTS

| | | |
|---|---|---|
| EP | 0380106 A2 | 8/1990 |
| EP | 0807983 A2 | 11/1997 |
| JP | 7-326817 | 12/1995 |
| JP | 07326817 A | 12/1995 |

OTHER PUBLICATIONS

European Search Report Dated Mar. 24, 2009.
Iwata et al., MGZNSETE/ZNCDSE/MGZNCDSE Double Hetrostructure Light-Emiting Diodes International Symposium on Blue Laser and Light Emitting Diodes, Sep. 29, 1998, pp. 437-440, XP-001027993.

(Continued)

*Primary Examiner*—Jerome Jackson, Jr.
(74) *Attorney, Agent, or Firm*—Brundidge & Stanger, P.C.

(57) ABSTRACT

The present invention aims at providing a structure in which a high p-type carrier concentration of $1\times10^{17}$ cm$^{-3}$ or more is obtained in a material in which, although it shows normally p-type conductivity, a carrier concentration smaller than $1\times10^{17}$ cm$^{-3}$ is only obtained. Also, the present invention aims at providing highly reliable semiconductor element and device each of which has excellent characteristics such as light emitting characteristics and a long lifetime.

Each specific layer, i.e., each $ZnSe_{0.53}Te_{0.47}$ layer (2 ML) is inserted between host layers, i.e., $Mg_{0.5}Zn_{0.29}Cd_{0.21}Se$ layers (each having 10 ML (atomic layer) thickness) each of which is lattice matched to an InP substrate. In this case, each specific layer in which a sufficient carrier concentration of $1\times10^{18}$ cm$^{-3}$ or more is obtained when a single layer is inserted at suitable intervals. As a result, a sufficient hole concentration of $1\times10^{17}$ cm$^{-3}$ or more is obtained in the overall crystal in a material in which a hole concentration smaller than $1\times10^{17}$ cm$^{-3}$ has been only conventionally obtained.

1 Claim, 18 Drawing Sheets

OTHER PUBLICATIONS

Faschinger et al., "Green II-VI light emitting diodes with long lifetime on InP substrate" Applied Physics Letters, AIP, American Institute of Physics, Melville, NY, Jul. 10, 2000, pp. 187-189, XP012026587.

Kishino et al., "Novel ZnCdSe/MgZnCdSe compound system grown on InP substrates by MBE and theoretical investigation of 550-640 nm range ZnCdSe/MgZnCdSe lasers" Journal of Crystal Growth, Elsevier, Amsterdam, NL. vol. 159, No. 1, Feb. 1, 1996, pp. 11-15, XP004021345.

Lin et al., "p-type doping of (Zn,Mg,Cd) Se alloys using a radio frequency discharge nitrogen plasma source", Journal of Vacuum Science & Technology B: Microelectronicsprocessing and Phenomena, American Vacuum Society, NY, vol. 18, No. 3, May 1, 2000, pp. 1534-1537, XP012008236.

Jung et al., "Carrier concentration enhancement of p-type ZnSe and ZnS by codoping with active nitrogen and tellurium by using a [delta]-doping technique", Applied Physics Letters, AIP, American Institute of Physics, Melville, NY, vol. 70, No. 9, Mar. 3, 1997, p. 1143, XP012018454.

Tao et al., "Doping of ZNTE by Molecular Beam Epitaxy" Applied Physics Letters, AIP, American Institute of Physics, Melville, NY, vol. 64, No. 14, Apr. 4, 1994, pp. 1848-1849, XP000440900.

Faschinger et al. "ZNMGSE TE Light Emitting Diodes", Applied Physics Letter, AIP, American Institute of Physics, Melville, NY, vol. 65, No. 25, Dec. 19, 1994, pp. 3215-3217, XO000486006.

Che et al., "Wide bandgap over 3eV and high p-doping BeZnTe grown on InP sustrates by molecular beam epitaxy" Journal of Crystal Growth, Elsevier, Amsterdam, NL, vol. 214-215, Jun. 1, 2000, pp. 321-324, XP00421018.

Shimbo et al., "Growth and characterization of novel MgSe/ZnCdSe superlattice quasi-quaternaries on InP substrates", Journal of Crystal Growth, Elsevier, vol. 184-185, Feb. 2, 1998, pp. 16-20, XP004370687.

Enhancement of p-type doping of ZnSe using a modified (N+Te)_-doping technique, Lin W. et al., Applied Physics Letters, vol. 76, No. 16, Apr. 17, 2000.

"Epitaxial growth of p-typeZnMgSSe", by H. Okuyama, et al., Appl. Phys. Lett. 64(7), Feb. 14, 1994, p. 904.

"Growth and Characterized of Nitrogen-doped MgSe/ZnSe I e superlattice Quasi-Quaternary" by W. Shinozaki et al., Jpn. J. Phys. vol. 38 (1999), p. 2598-2602.

N. Dai, et al., Appl. Phys. Lett. 66(20), May 15, 1995, p. 2742.

T. Morita et al., "Molecularbeam epitaxial growth of MgAnCdSe on (100) InP substrates", Journal of Electronic Materials, vol. 25, No. 3, 1996, p. 425.

L. Zeng et al., "Red-green-blue photopumped lasing from ZnCdMgSe/ZnCdSe quantum well laser structure grown on InP" Appl. Phys. Lett. vol. 72, No. 24, Jun. 15, 1998, p. 3136.

W. Lin et al., Journal of Applied Physics, vol. 84, No. 3, Aug. 1, 1998, p. 1472.

R.M. Park et al., "p-type ZnSe by nitrogen atom beam doping during molecular beam epitaxial growth", Appl. Phys. Lett. 57(20), Nov. 12, 1990, p. 2127.

K. Ohkawa et al., "Characteristics of p-type ZnSe Layers Grown by Molecular Beam Epitaxial with Radical Doping", Japanese Journal of Applied Physics, vol. 30, No. 2A, Feb. 1991, p. L152.

H. Okuyama et al., "Epitaxial growth of P-type ZnMgSSe", Appl. Phys. Lett. 64(7), Feb. 14, 1994, p. 904.

K. Naniwa et al., "Epitaxial growth of n- and p-type AnCdSe on InP", Journal of Crystal Growth, 184/187, (1998) 450-454.

* cited by examiner

OPTICAL SEMICONDUCTOR DEVICES ON INP SUBSTRATE

CLAIM OF PRIORITY

The present application claims priority from Japanese application JP 2005-256566 filed on Sep. 5, 2005, the content of which is hereby incorporated by reference into this application.

FIELD OF THE INVENTION

The present invention relates to an optical semiconductor devices on an InP substrate. In particular, the invention relates to an Optical Semiconductor Devices having a p-type cladding layer or the like in which a sufficient p-type carrier concentration (of $1 \times 10^{17}$ cm$^{-3}$ or more) and a wide band gap can be obtained by inserting semiconductor layers, in which a p-type high carrier concentration can be obtained, between semiconductor cladding layers or the like, for which heavy doping is difficult to perform in a compound semiconductor which is mainly constituted by a group II element and a group VI element although it has a wide band gap.

Also, the invention relates to an optical element such as a semiconductor laser diode (LD), a light emitting diode (LED) or a photo-detecting device (PD) employing a p-type cladding layer made by utilizing the above-mentioned method, and is suitable for being applied to an optical device.

BACKGROUND OF THE INVENTION

A semiconductor device which emits light with a visible range to an ultraviolet range, i.e., a semiconductor laser or a light emitting diode has been one of the important semiconductor devices in the modern society/industrial world, since the semiconductor laser or the light emitting diode can be used for an optical information recording device (a compact disc (CD), a digital versatile disc (DVD) or a Blue-ray disc (BD)), a light source for a color display apparatus, a device for excitation of a solid-state laser, a device for processing, a device for a sensor, a device for a measuring instrument, a device for medical care, or a device for application to a white lamp.

As a semiconductor material for these optical elements, a group III-V compound such as AlGa(In)As has been used in an infrared device having a 780 nm, 808 nm, 860 nm, 915 nm or 980 nm band up to today. An AlGaInP III-V compound semiconductor is used as a material in the red light device having a light emitting wavelength of a 600 nm band (especially, 635 to 670 nm). In addition, an AlGaInN III-V nitride semiconductor is used in a blue light device having a light emitting wavelength of a 400 nm band (especially, 400 to 480 nm). The red light device and the blue light device have come into practical use through the progress of the research and the development.

However, with regard to the semiconductor devices for emitting light with a wavelength corresponding to yellow light to green light which is about a 500 nm band and is an intermediate wavelength band between a wavelength band of red light and a wavelength band of blue light, the material exploitation has not been sufficiently performed, not to mention the research and development. For this reason, in particular, with respect to the laser diode, the performance enough to realize its practical application has not yet been realized.

The group II-VI compound semiconductor, along with the group III-V compound semiconductor, is useful as semiconductor materials for these optical devices. In general, however, since a p-type conductivity property is difficult to control, a p-type semiconductor layer of a pn junction type semiconductor device can be realized only when limited kinds of group II-VI compound semiconductors such as ZnSe are used. In the group II-VI compound semiconductors, in general, as a band gap width becomes wider, a p-type carrier concentration decreases, resulting in that any of these group II-VI compound semiconductors cannot be utilized in the pn junction type semiconductor device. For example, in the case of ZnMgSSe which is lattice matched to a GaAs substrate, a band gap width can be widened in accordance with an increase in Mg composition ratio. When the band gap width becomes equal to or larger than 3 eV, however, a p-type carrier concentration becomes a small value smaller than $1 \times 10^{17}$ cm$^{-3}$. In addition, even in the case of an MgSe/ZnSeTe superlattice which is lattice matched to the InP substrate, when the band gap width becomes equal to or larger than 2.6 eV, likewise, only a small p-type carrier concentration is obtained. The technique as described above is disclosed in a literature of H. Okuyama, Y. Kishita, T. Miyajima and A. Ishibsashi, "Epitaxial growth of p-type ZnMgSSe", Appl. Phys. Lett., 64(7) 1994, page 904, and a literature of W. Shinozaki, I. Nomura, H. Shimbo, H. Hattori, T. Sano, Song-Bek Che, A. Kikuchi, K. Shimomura and K. Kishino, "Growth and characterization of nitrogen-doped MgSe/ZnSeTe superlattice quasi-quaternary on InP substrates and fabrication of light emitting diode", Jpn. J. Appl. Phys., 38(4B) 1999, p. 2598.

Under such circumstances, the inventors of this application, and several research groups in Japan and other countries have paid attention to an $Mg_xZn_yCd_{1-x-y}Se$ II-VI compound semiconductor which can be formed through crystal growth on an InP semiconductor substrate and which is lattice matched to the InP substrate as a candidate of a material for formation of semiconductor devices which emit light with a wavelength corresponding to yellow light to green light, and have researched and developed the $Mg_xZn_yCd_{1-x-y}Se$ II-VI compound semiconductor. This technique is disclosed in a literature of N. Dai et al.: Appl. Phys. Lett., 66, 2742(1995) and a literature of T. Morita et al.: J. Electron. Mater., 25, 452 (1996). The $Mg_xZn_yCd_{1-x-y}Se$ II-VI compound semiconductor has such a feature that the $Mg_xZn_yCd_{1-x-y}Se$ II-VI compound semiconductor is lattice matched to InP when its composition ratios (x, y) fulfill a relationship of y=0.47–0.37x (x=0 to 0.8, y=0.47 to 0.17), and its band gap width can be controlled from 2.1 eV to 3.6 eV by changing its composition ratios from (x=0, y=0.47) to (x=0.8, y=0.17).

In addition, in the above-mentioned composition range, all the band gap widths show a direct transition type. The band gap width corresponds to a wavelength of 590 nm (orange color) to 344 nm (ultraviolet) when being converted into a wavelength. This suggests that an active layer and a cladding layer which constitute a double hetero structure as a basic structure of each of the semiconductor devices which emit light with a wavelength corresponding to yellow light to green light can be realized by only changing the composition ratios of $Mg_xZn_yCd_{1-x-y}Se$.

Actually, in the measurement of photoluminescence of $Mg_xZn_yCd_{1-x-y}Se$ which is grown on an InP substrate by utilizing a molecular beam epitaxy (MBE) method, the satisfactory light emitting characteristics are obtained in which a peak wavelength ranges from 571 nm to 397 nm in the $Mg_xZn_yCd_{1-x-y}Se$ materials having different composition ratios. The satisfactory light emitting characteristics are described in the literature of T. Morita et al.: J. Electron. Mater., 25, 425 (1996).

In addition, for a laser structure using $Mg_xZn_yCd_{1-x-y}Se$, laser oscillation has been reported, due to light excitation in wavelength bands corresponding to red light, green light and blue light. This report is described in a literature of L. Zeng et al.: Appl. Phys. Lett., 72, 3136 (1998).

On the other hand, the laser oscillation due to current driving for a semiconductor laser diode constituted by only $Mg_xZn_yCd_{1-x-y}Se$ has not yet been reported until now. It is considered that the main cause for which the laser oscillation is not obtained is due to difficulty in p-type conductivity controlled by impurity doping into $Mg_xZn_yCd_{1-x-y}Se$.

The double hetero structure is the basic structure of the semiconductor laser diode. The active layer is sandwiched between the cladding layers each having a band gap width wider than that of the active layer. Here, it is obvious from the above-mentioned research reports that $Mg_xZn_yCd_{1-x-y}Se$ has the excellent property in terms of the active layer material.

In addition, the n-type conductivity control for $Mg_xZn_yCd_{1-x-y}Se$ is obtained from the doping of chlorine atoms, and an n-type carrier (electron) concentration of $1\times10^{18}$ cm$^{-3}$ or more has been reported. This report is described in a literature of W. Lin et al.: Appl. Phys. Lett., 84, 1432 (1998). However, with regard to a p-type conductivity control, a p-type carrier concentration of $1\times10^{17}$ cm$^{-3}$ or more which is required for the laser diode has not yet been reported.

Conventionally, a technique for the doping of radical nitrogen having a high energy during the crystal growth made by utilizing the molecular beam epitaxy method has been mainly adopted for the p-type conductivity control for the group II-VI compound semiconductor, especially, ZnSe or MgZnSSe. This technique is described in a literature of R. M. Park et al.: Appl. Phy. Lett., 57, 2127 (1990) and a literature of K. Ohkawa et al.: Jpn. J. Appl. Phys., 30, L152 (1991). Thus, the p-type carrier concentration of $1\times10^{17}$ cm$^{-3}$ or more has been reported. This report is described in the literature of H. Okuyama et al.: Appl. Phys. Lett., 64, 904 (1994).

The p-type conductivity control for $Mg_xZn_yCd_{1-x-y}Se$ has been attempted by using the same technique. However, the p-type doping concentration of $3.5\times10^{16}$ cm$^{-3}$ in ZnCdSe having composition ratios (x=0, y=0.48) has been only reported. This report is described in a literature of K. Naniwae et al.: J. Cryst. Growth, 184/185, 450 (1998). Thus, neither of the high doping concentration of $3.5\times10^{16}$ cm$^{-3}$ or more nor the p-type conductivity in $Mg_xZn_yCd_{1-x-y}Se$ (x>0) having a band gap wider than that of ZnCdSe has not yet been obtained.

The cause of difficulty of the high p-type doping in $Mg_xZn_yCd_{1-x-y}Se$ has not yet been clarified. However, it is considered that the cause may be that at least an ideal impurity dopant which is replaced with a part of atoms arranged in the $Mg_xZn_yCd_{1-x-y}Se$ crystal to be stably present in the crystal and which efficiently discharges holes with low energy, has not yet been found out, or is not present. This is an essential problem in characteristics which $Mg_xZn_yCd_{1-x-y}Se$ has.

At that, for the purpose of increasing the maximum p-type carrier concentration which a cladding layer having a wide band gap can obtain, it has been proposed that a p-type cladding layer is made in the form of a superlattice structure made of a material including at least any one atom of Mg, Ca, Sc, Ti, V, Cr, Mn, Fe, Co and Ni, in a light emitting element constituted by a group II-VI compound semiconductor. However, the sufficient characteristics have not yet been obtained. This report is described in Japanese Patent Laid-open Publication No. 07-326817.

SUMMARY OF THE INVENTION

In the light of the foregoing description, it is an object of the present invention to provide a structure in which, in order to realize an optical element such as a laser diode, a light emitting diode or a photo-detecting device, a high p-type carrier concentration of $1\times10^{17}$ cm$^{-3}$ or more is obtained in such a material in which only a carrier concentration lower than $1\times10^{17}$ cm$^{-3}$ is obtained although having a p-type conductivity in the normal case. The material is, for example, an $Mg_xZn_yCd_{1-x-y}Se$ having a wide band gap and being able to become a cladding layer.

Moreover, it is another object of the present invention to provide a p-type semiconductor layer structure with which an optical semiconductor element and device can be readily manufactured each of which has satisfactory characteristics such as light emitting characteristics, high reliability and a long lifetime.

The inventors of this application have earnestly studied in order to attain the above-mentioned objects. An outline thereof is described as follows. The inventors have repeatedly made improvements on a technique for the semiconductor materials in each of which only the low p-type conductivity was obtained by utilizing the conventional method. As a result, the inventors have succeeded in manufacturing a p-type semiconductor layer which has a high p-type carrier concentration of $1\times10^{17}$ cm$^{-3}$ or more, less crystal defects, and excellence in crystalline characteristics with a low resistance in terms of electric conduction.

Such a semiconductor layer can be realized and is used in manufacturing of an element. Thus, this semiconductor layer is expected to greatly contribute to realization of an optical element and device such as a laser diode and a light emitting diode which emits light with a wavelength corresponding to yellow light to green light, which have not been conventionally able to be realized.

The reason that the inventors use an InP substrate will be described below. In the laser diode emitting green light and being not satisfactory in light emitting characteristics, especially, lifetime characteristics, although it has been conventionally searched and developed, GaAs has been employed in the substrate; ZnCdSe has been employed in the active layer; and ZnMgSSe have been employed in the n-type cladding layer and the p-type cladding layer.

With this structure, in ZnMgSSe employed in the p-type cladding layer, a band gap width can be increased with an increase in Mg composition ratio. However, when the band gap width becomes equal to or larger than 3 eV, the p-type carrier concentration becomes a small value smaller than $1\times10^{17}$ cm$^{-3}$. At this time, even when N (nitrogen) as a dopant with an atom concentration of $1\times10^{19}$ cm$^{-3}$ or more is contained, the p-type carrier concentration becomes a small value smaller than $1\times10^{17}$ cm$^{-3}$. In other words, the p-type carrier activation rate is said to be equal to or smaller than 1%. That is, N, which does not become the p-type carrier, becomes not only an intra-lattice atom which falls into a VI side of ZnMgSSe, but also an interstitial atom, i.e., an interstitial defect.

Moreover, ZnCdSe as the light emitting is not lattice matched to the GaAs substrate, and its lattice is larger than that of GaAs. This means that ZnCdSe causes a compressive strain.

When a driving current flows to this lamination structure via electrodes, a crystal defect group mainly with a large quantity of interstitial defects existing in a p-type ZnMgSSe cladding layer is propagated and diffused into an ZnCdSe active layer as a light emitting area having a compressive strain to generate nonradiative centers. Finally, the heat is generated to stop the light emission, causing irreversible crystal damage and the end of its lifetime.

More generally, in the semiconductor light emitting element and the photo-detecting device, the defects are propagated and diffused from the area having a maximum number of crystal defects due to an influence of the heat, electric conduction, strain and the like to finally reach the light emitting area (active area), thereby causing degradation of the element and ending the element lifetime. When the semiconductor optical element is manufactured, it is necessary to exclude an adverse influence exerted on the element having the crystal defects or to reduce the adverse influence exerted thereon.

The inventors have paid attention to the InP substrate from a viewpoint of the means for solving the problems, and have employed a compound semiconductor material for the active layer as the light emitting area which is lattice matched the InP substrate. In other words, the inventors, for example, have employed BeZnSeTe which has nearly the same lattice size as that of the InP substrate and thus in which no strain substantially exists. Moreover, the inventors, for example, have adopted MgZnCdSe which has nearly the same lattice size as that of the InP substrate and thus in which no strain substantially exists for the cladding layer, and have confirmed the satisfactory n-type conductivity. Next, the inventors have examined the p-type conductivity. As a result, only the carrier concentration smaller than $1 \times 10^{17}$ cm$^{-3}$ has been obtained in the case of the N radical doping which has been conventionally used. Then, as a result of studies, the following optical semiconductor is proposed as a technique for manufacturing a p-type semiconductor layer which has a p-type carrier concentration of $1 \times 10^{17}$ cm$^{-3}$ or more and thus which has the less crystal defects and has the excellent crystalline characteristics because of having a low resistance in terms of electric conduction. The proposed optical semiconductor device comprises an n-type cladding layer, an active layer and p-type cladding layer on an InP substrate. Then the p-type cladding layer consists of a superlattice with a first layers and a second layers. The first layers have wide band gap, while the second layers have an ability to be highly p-type doped with high carrier concentration.

In the present invention constituted as described above, the semiconductor layer has the high p-type carrier concentration of $1 \times 10^{17}$ cm$^{-3}$ or more, and the excellent crystalline characteristics with less crystal defects because of having the low resistance. The semiconductor layer can be manufactured by using the semiconductor material in which only the low p-type conductivity has been obtained by utilizing the conventional method.

Such a semiconductor layer can be formed and thus is used in manufacturing of the element, which results in that it is possible to realize the manufacturing of the semiconductor device, the laser diode and the light emitting diode which have been conventionally unable to be realized and which, for example, emits light with a wavelength corresponding to yellow light to green light.

According to the present invention, it is possible to realize the Optical Semiconductor Devices which has higher practicability than that of the conventional one.

Figure 7A:
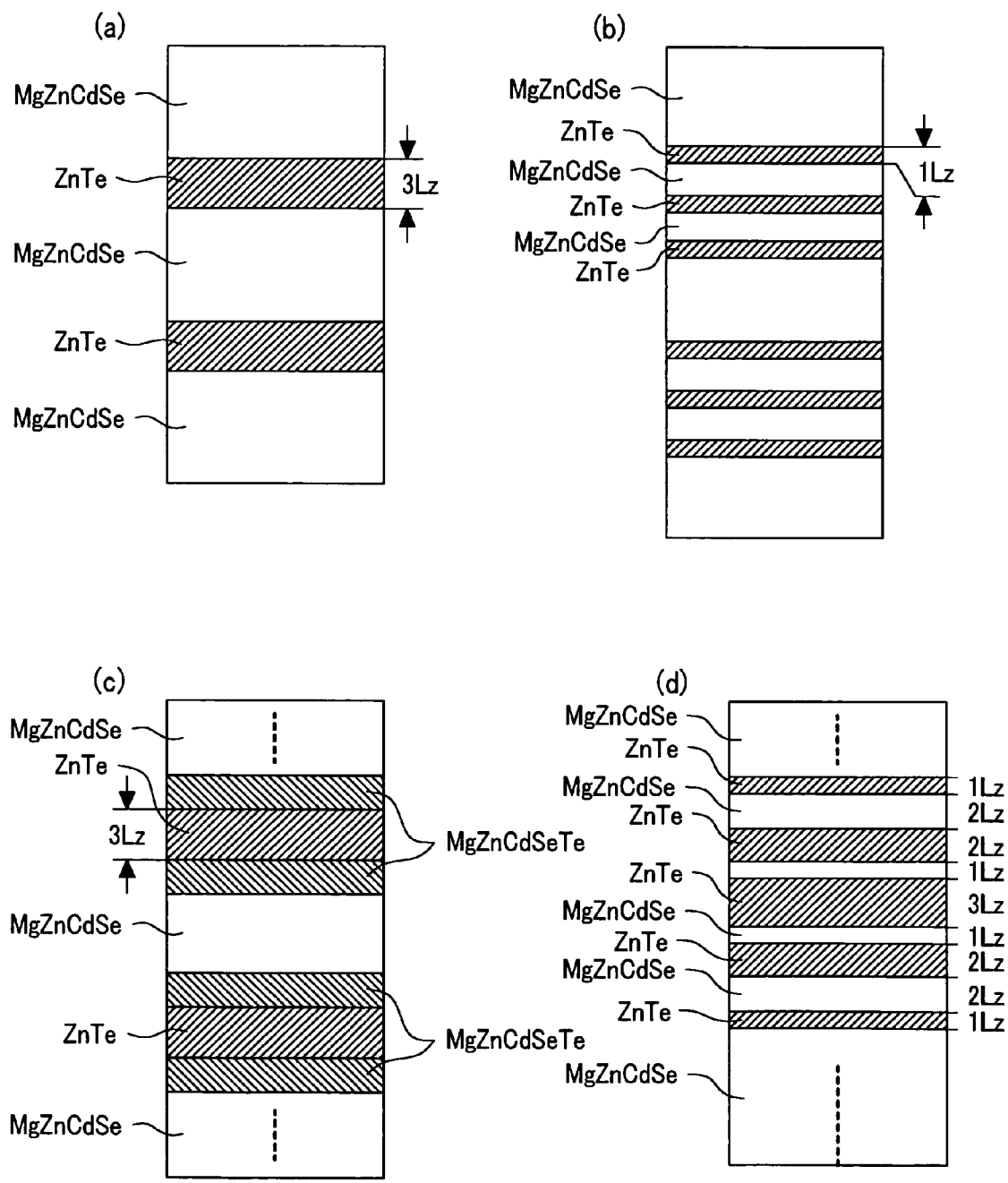
Figure 7B:
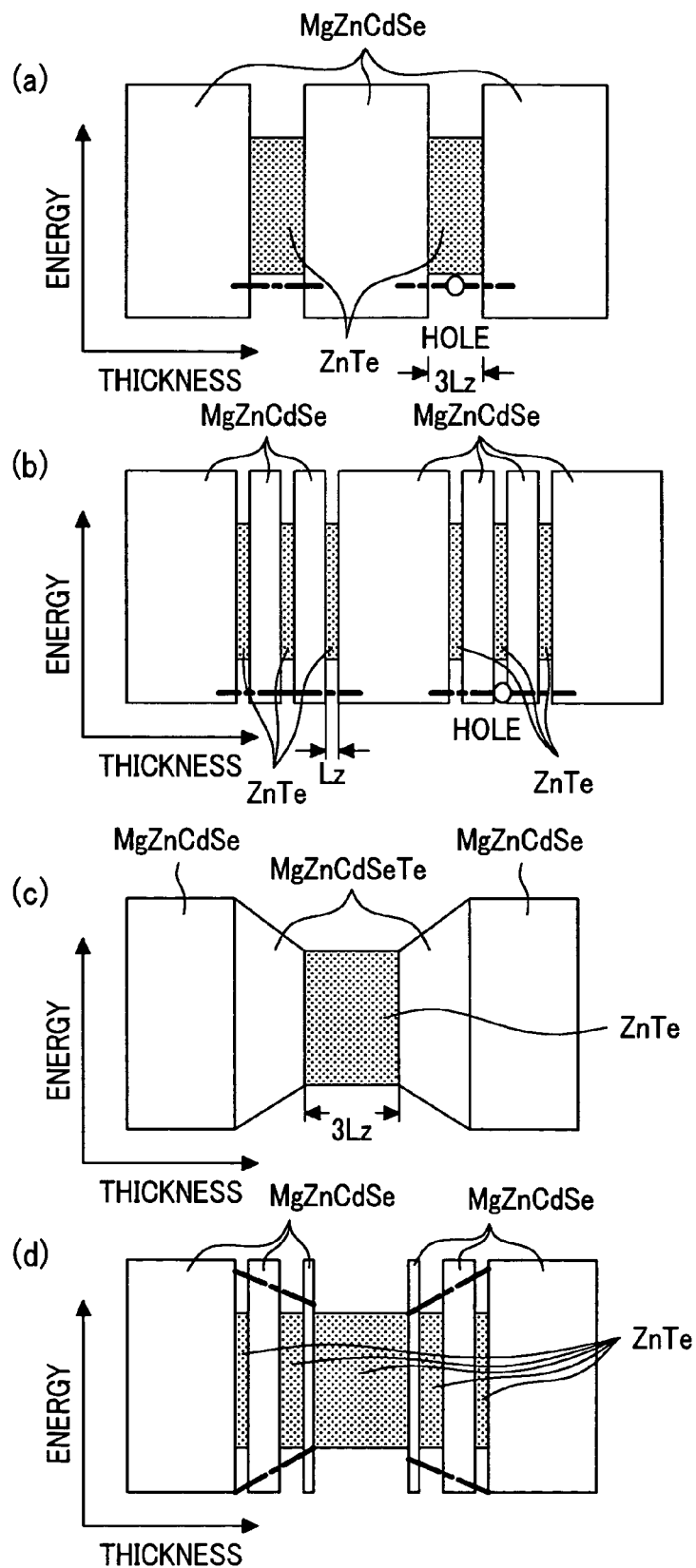
Figure 8A:
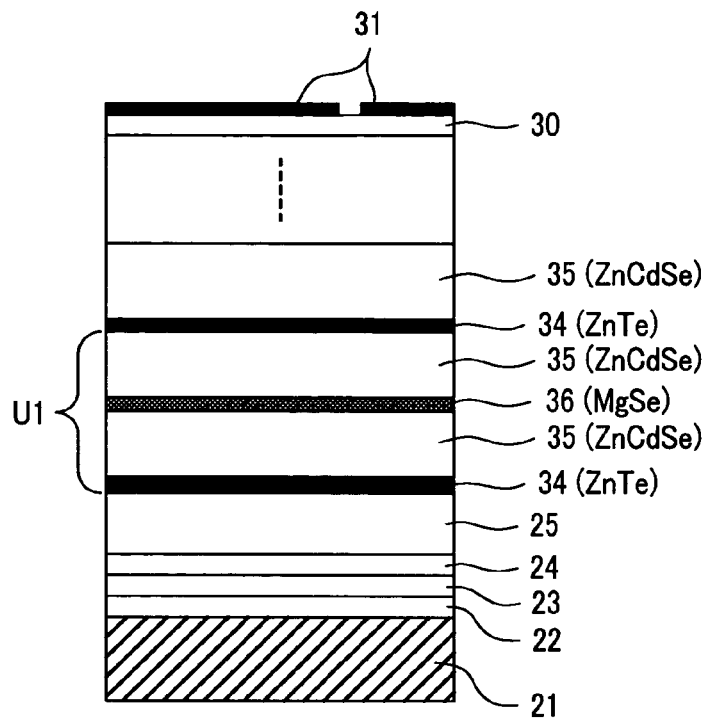
Figure 8B:
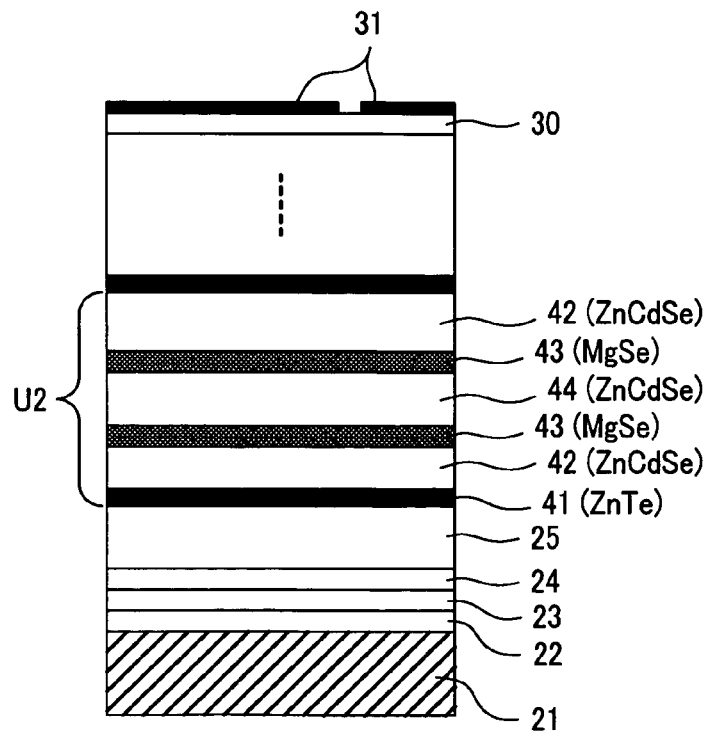
Figure 9:
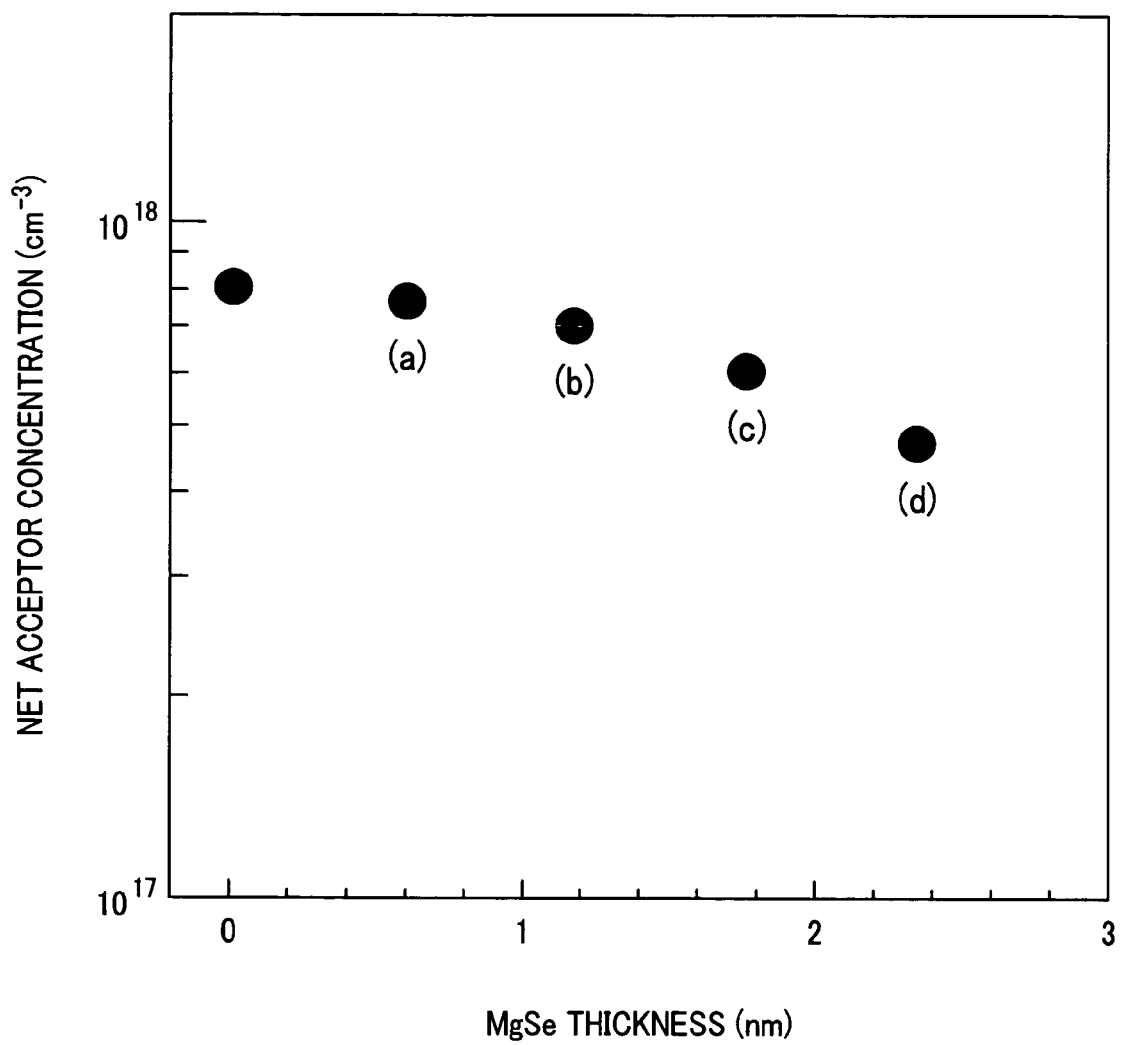
Figure 10:
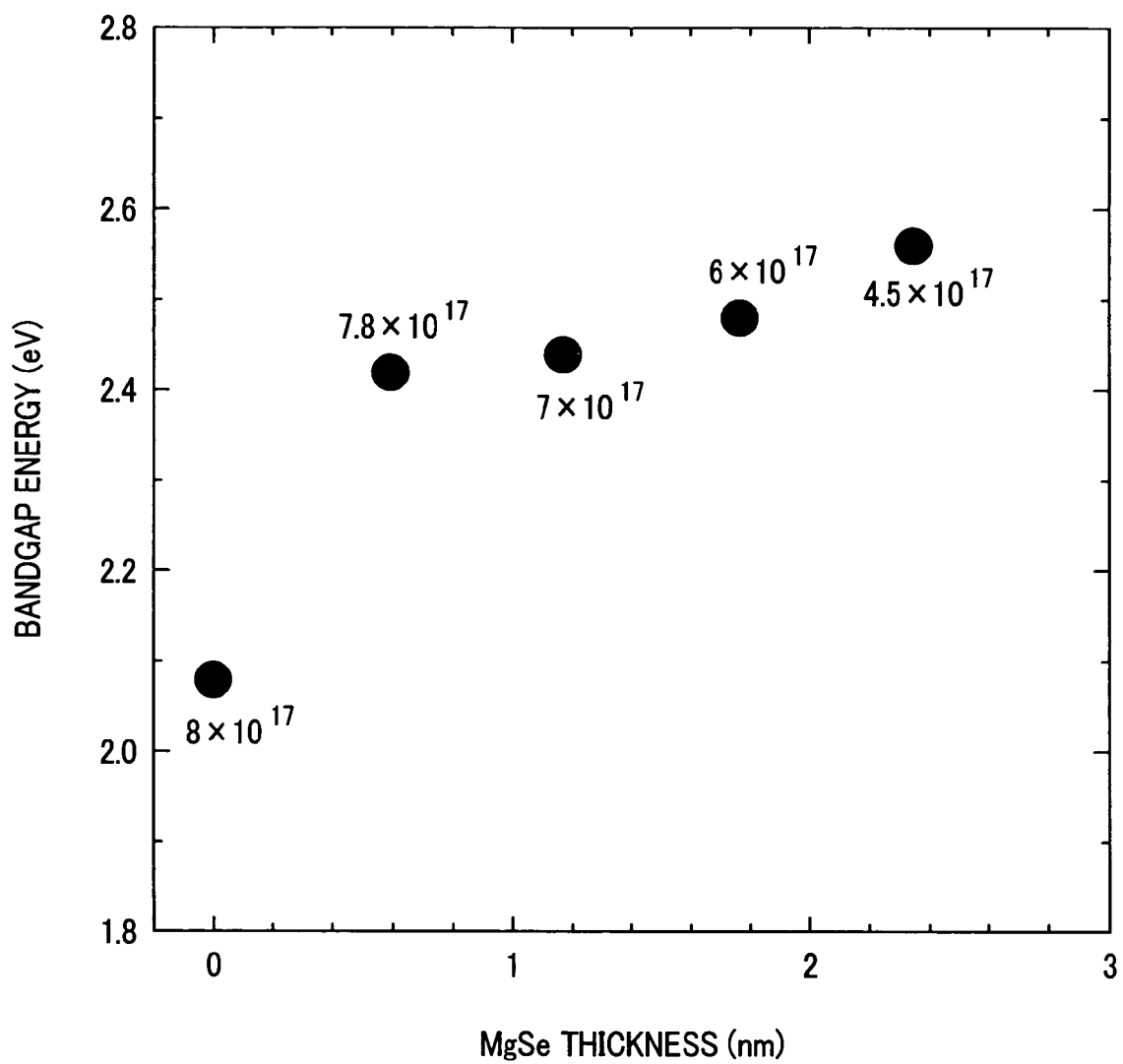
Figure 11:
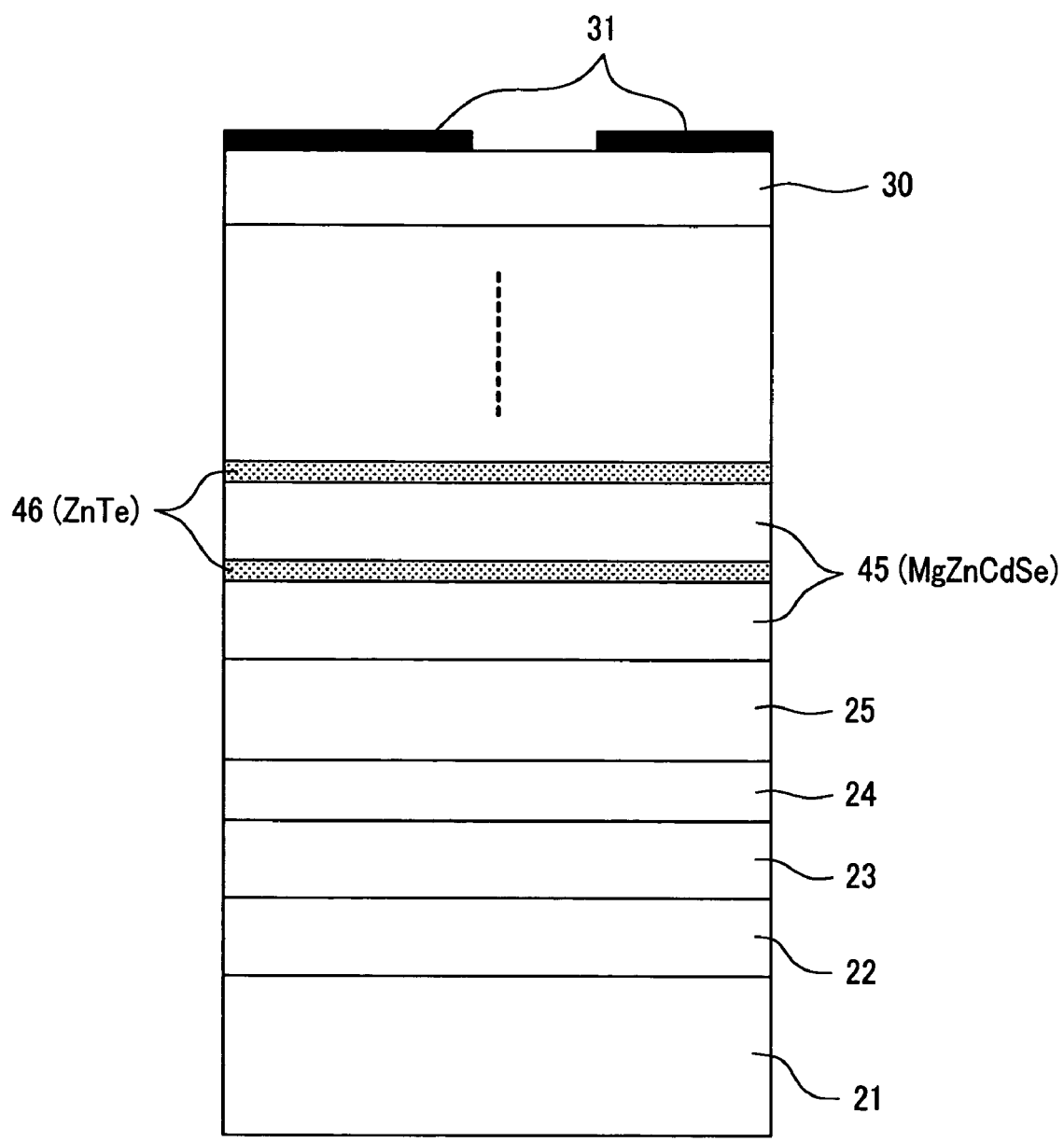
Figure 12:
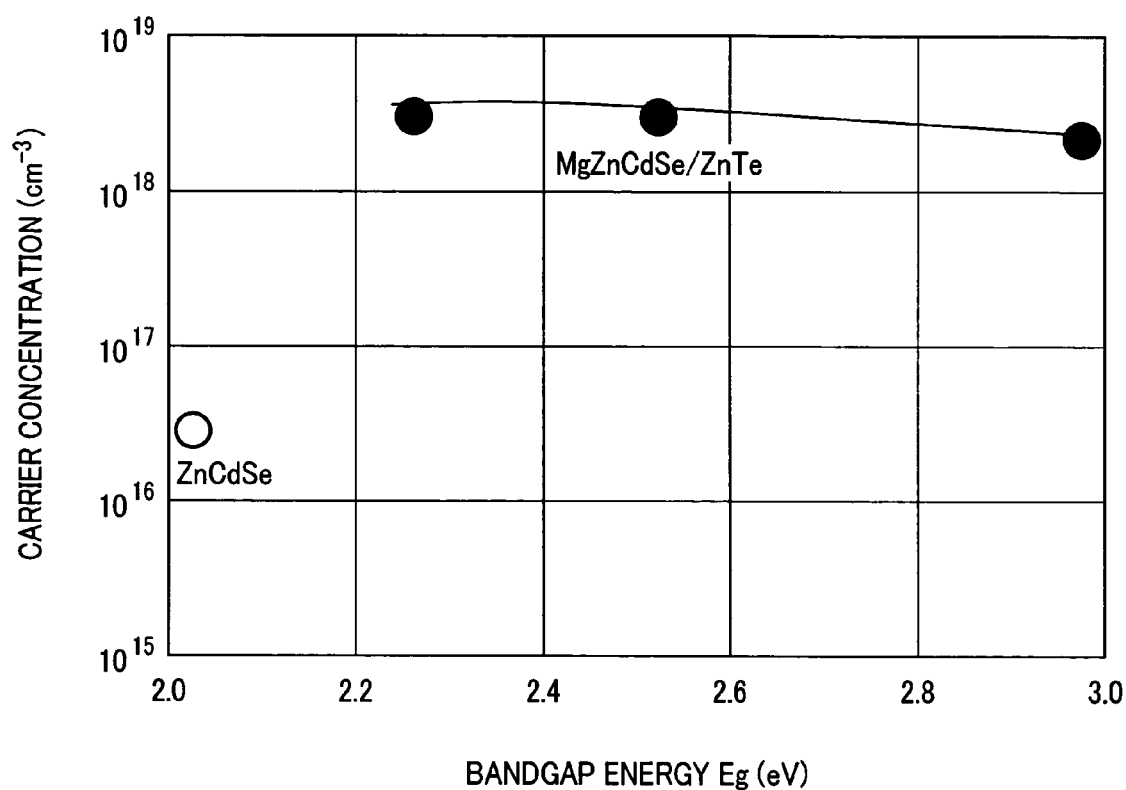
Figure 13A:
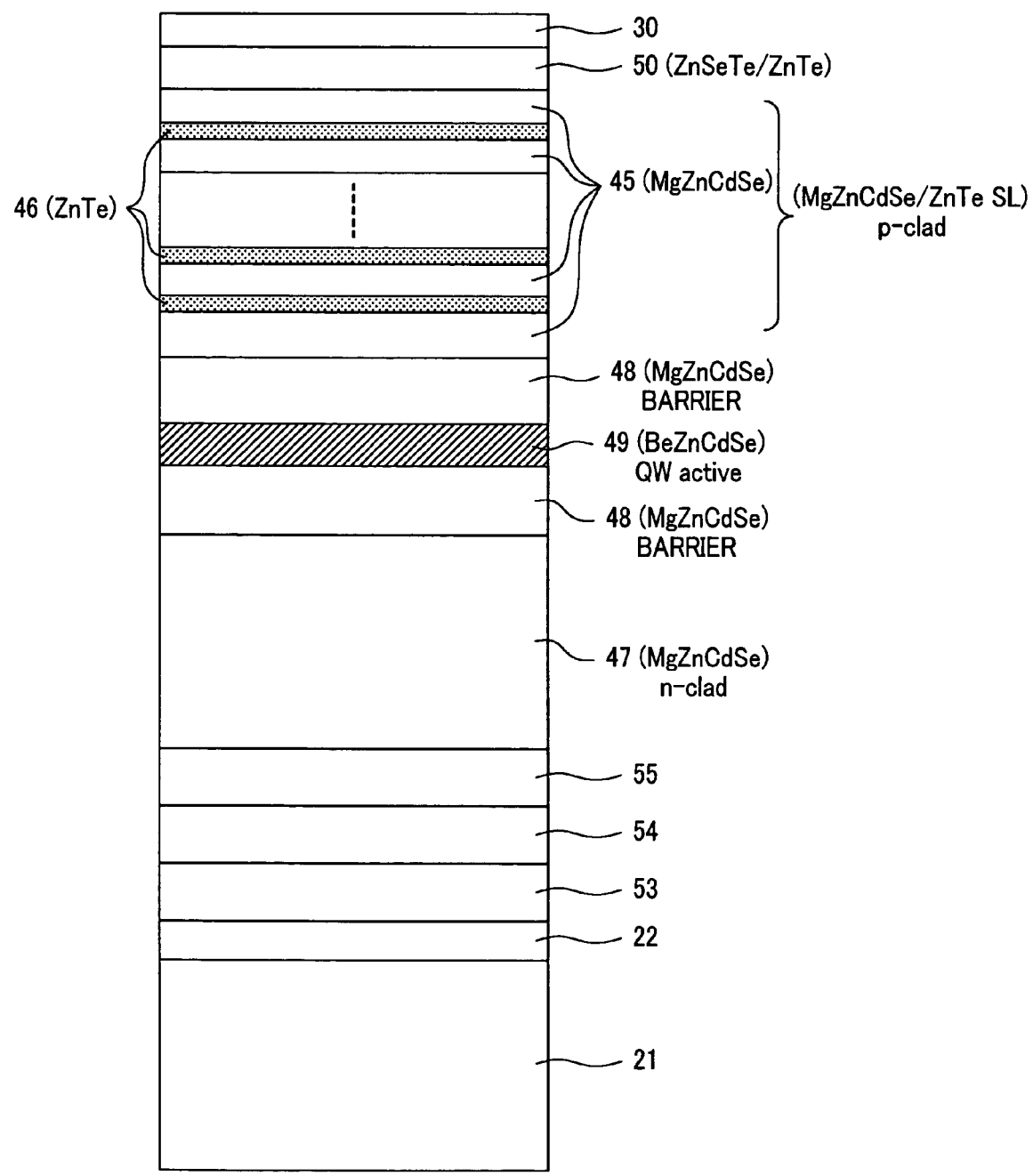
Figure 13B:
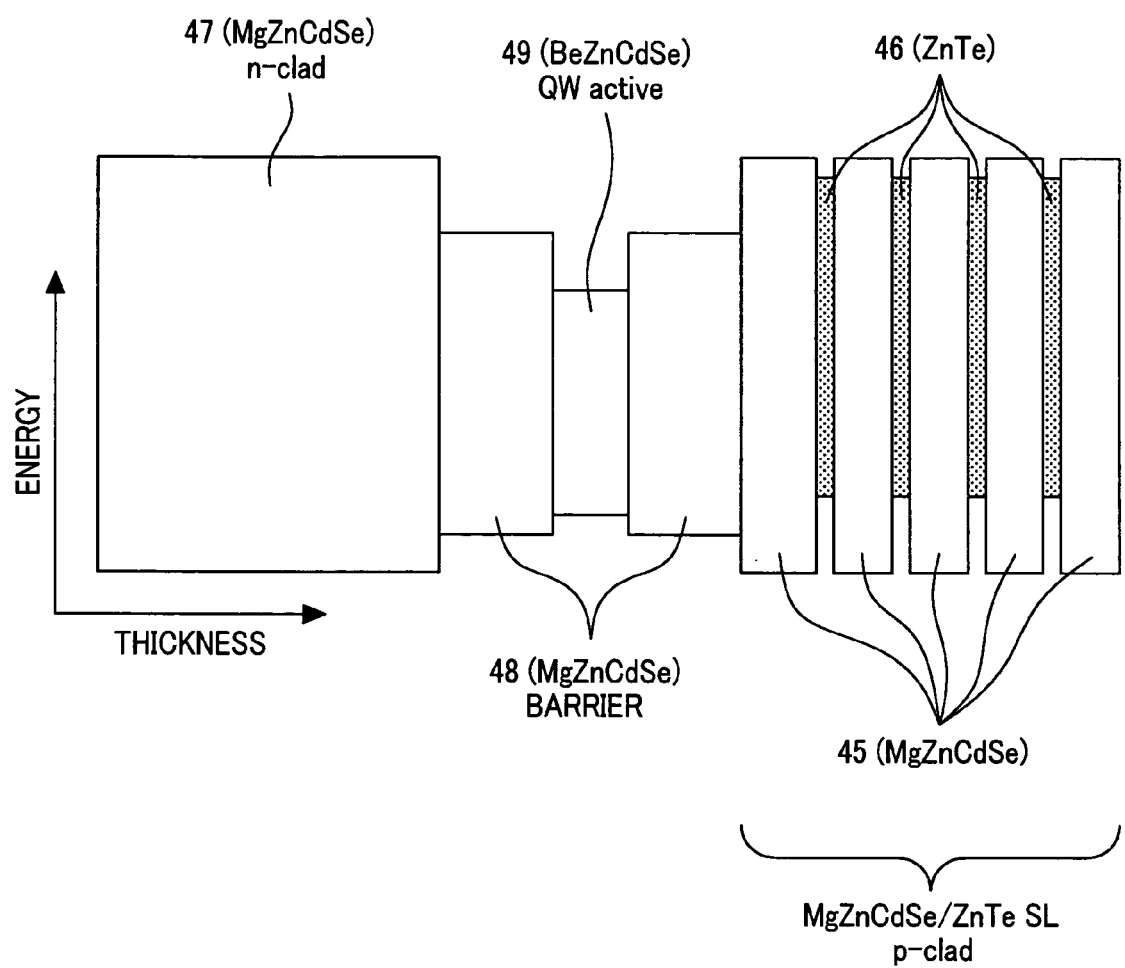

Parts (a) to (d) of FIG. 7A are cross sectional views explaining other application examples of the lamination structure as the structure with layer thicknesses modulated in which the thicknesses of the host layer and the specific layer are regularly changed in the first embodiment of the present invention;

Parts (a) to (d) of FIG. 7B are energy diagrams showing energy in a lamination direction obtained in the lamination structures which are shown in parts (a) to (d) of FIG. 7A, respectively;

FIGS. 8A and 8B are cross sectional views explaining two structural examples according to a second embodiment of the present invention;

FIG. 9 is a graphical representation showing a relationship between an effective acceptor concentration and an MgSe layer thickness for one cycle in an MgSe/ZnCdSe/ZnTe superlattice in the second embodiment of the present invention;

FIG. 10 is a graphical representation showing a relationship between a band gap width and the MgSe layer thickness for one cycle in the MgSe/ZnCdSe/ZnTe superlattice in the second embodiment of the present invention;

FIG. 11 is a cross sectional view explaining a lamination structure of host layers and specific layers which have respective given film thicknesses according to a third embodiment of the present invention;

FIG. 12 is a graphical representation showing a relationship between an energy gap and a carrier concentration of an MgZnCdSe/ZnTe superlattice in the third embodiment of the present invention;

FIG. 13A is a cross sectional view explaining a semiconductor laser structure according to a fourth embodiment of the present invention;

FIG. 13B is an energy diagram showing energy, in a lamination direction, obtained in a lamination structure shown in FIG. 13A;

FIGS. 14A to 14E are perspective views explaining the first half of a general procedure for forming individual optical semiconductor devices from an epitaxial wafer explained in FIGS. 13A and 13B; and FIGS. 15A to 15D are perspective views explaining the second half of the general procedure for forming the individual optical semiconductor devices from the epitaxial wafer explained in FIGS. 13A and 13B.

DESCRIPTION OF THE PREFERRED
EMBODIMENTS

Embodiments of the present invention will be described hereinafter with reference to the accompanying drawings. In all the figures for the embodiments, the same or corresponding portions are designated with the same reference numerals.

Even when $Mg_xZn_yCd_{1-x-y}Se$ has been subjected to the conventional radical nitrogen doping which has been performed for the group II-VI compound semiconductor (ZnSe or MgZnSSe) to optimize MBE growth conditions such as a nitrogen flow rate, an RF output, a growth temperature and VI/II composition ratios, the p-type carrier concentration of about $3.5 \times 10^{16}$ cm$^{-3}$, i.e., the p-type carrier concentration smaller than $1 \times 10^{17}$ cm$^{-3}$ has been obtained at a maximum value, and thus the p-type carrier concentration of $1 \times 10^{17}$ cm$^{-3}$ or more could not have been realized.

As a result of the examinations of the inventors, the investors devised another doping technique. In the present invention, in order to attain this, each second thin film semiconductor crystal layer which is heavily doped with a p-type dopant with a dose of about $1 \times 10^{18}$ cm$^{-3}$ to about $1 \times 10^{20}$ cm$^{-3}$ are inserted at suitable intervals between first layers, e.g., $Mg_xZn_yCd_{1-x-y}Se$ crystal layers. As a result, a sufficient p-type carrier concentration can be obtained in the overall resulting semiconductor crystal.

Differences between several known techniques and the technique of the present invention are described below. For the purpose of increasing the maximum p-type carrier concentration which the cladding layer having the wide band gap can obtain, Japanese Patent Laid-open Publication No. 07-326817 has proposed that the p-type cladding layer is made in the form of the superlattice structure made of the material including at least any one atom of Mg, Ca, Sc, Ti, V, Cr, Mn, Fe, Co and Ni in the light emitting element constituted by using the group II-VI compound semiconductor. More specifically, this technique was devised on MgZnSSe and ZnSSe each of which is lattice matched to the GaAs substrate. These technical points are clearly different from those, of the present invention, in which, for example, both typical MgZnCdSe and ZnSeTe on an InP substrate are doped with N atoms to form a p-type cladding layer.

A difference in technical contents between a literature of W. Lin et al.: Applied Lett., Vol. 76 (2000), p. 2205 and the present invention will be described below. This literature describes a method of performing delta doping of Te and N atoms after lamination of ZnSe in order to increase a p-type carrier concentration of ZnSe. However, in the present invention, for example, both the typical MgZnCdSe and ZnSeTe (which are perfect growth layers obtained without the delta doping) on an InP substrate are doped with N atoms to form the p-type cladding layer. Consequently, both the techniques are clearly based on the different concepts.

A difference in technical contents between a literature of W. Lin et al.: Journal of Vacuum Science & Technology, B (Vol. 18 (2000), p. 1534) and the present invention will be described below. In the case of the technique described in this literature, in order to increase a p-type carrier concentration of (Zn, Mg, Cd) Se on an InP substrate, a (Zn, Mg, Cd) Se layer, and a superlattice layer of a ZnSe layer having a carrier concentration of $1 \times 10^{18}$ cm$^{-3}$ at a maximum value in terms of a single layer, are laminated, and only the ZnSe layer is doped with N atoms. However, in the present invention, for example, both the typical MgZnCdSe and ZnSeTe (which are perfect growth layers obtained without the delta doping) on an InP substrate are doped with N atoms to form the p-type cladding layer. Consequently, both the techniques are clearly based on the different concepts.

A difference in technical contents between a literature of H. D. Jung et al.: Applied Physics Lett., (Vol. 70 (1997), p. 1143) and the present invention will be described below. In the case of the technique described in this literature, in order to increase a carrier concentration of ZnSe, only ZnTe having one atomic layer or less is delta-doped with N atoms, and the resulting layer is inserted between ZnSe layers. However, in the present invention, for example, both the typical MgZnCdSe and ZnSeTe (which are perfect growth layers obtained without the delta doping) on an InP substrate are doped with N atoms to form the p-type cladding layer. Consequently, both the techniques are clearly based on the different concepts.

The present invention provides the unique p-type cladding layer as described above, thereby providing an optical semiconductor device which has an n-type cladding layer, an active layer and this p-type cladding layer on an InP substrate. The p-type cladding layer will be described below.

Figure 1:
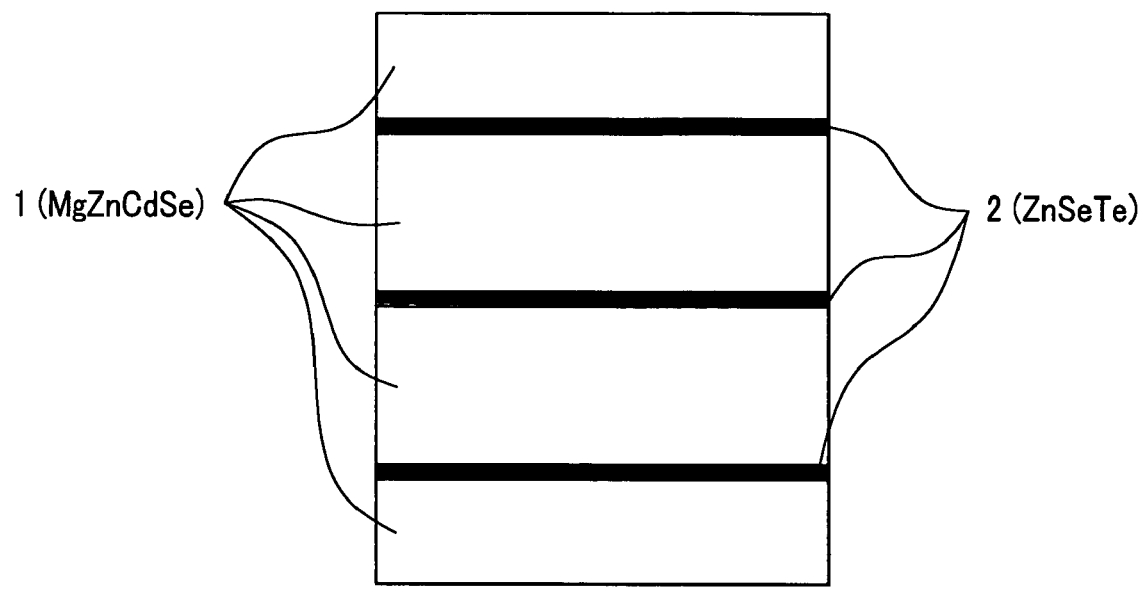
FIG. 1 is a first conceptual schematic view of the present invention, i.e., a cross sectional view schematically showing a structure, according to the present invention, in which each specific layer is inserted between host layers.

FIG. 1 is a first conceptual schematic view of an embodiment mode of the present invention, i.e., a cross sectional view schematically showing a structure, according to the present invention, in which each specific layer is inserted between host layers. The overall structure is doped with a p-type dopant. For example, in this case, a principal first semiconductor layer 1 (hereinafter referred to as a host layer) is supposed as being made of $Mg_xZn_yCd_{1-x-y}Se$ (ZnCdSe when x=0). Composition ratios x and y of $Mg_xZn_yCd_{1-x-y}Se$ are arbitrarily set, whereby an energy gap of this semiconductor layer can be changed from 1.764 eV (CdSe) to 4.0 eV (MgSe), and also a lattice constant thereof can be changed from 5.668 Å (ZnSe) to 6.057 Å (CdSe).

In each of embodiments of the present invention, the host layer made of $Mg_xZn_yCd_{1-x-y}Se$ (which may be ZnCdSe when x=0) is employed which is lattice matched to an InP substrate (its lattice constant is 5.869 Å) which generally and widely exists. The semiconductor layer is grown while the lattice matching is maintained, whereby it is possible to obtain a high-quality semiconductor layer substantially without strains and with less crystal defects.

More specifically, the $Mg_xZn_yCd_{1-x-y}Se$ layer which is lattice matched to the InP substrate is a compound semiconductor layer in which the composition ratios (x, y) of the $Mg_xZn_yCd_{1-x-y}Se$ layer especially fulfill a relational expression of y=0.47−0.37x (x=0 to 0.8, and y=0.47 to 0.17) and fall within the range of (x=0, y=0.47) to (x=0.8, y=0.17).

In FIG. 1, each $ZnSe_{0.53}Te_{0.47}$ layer (2 ML) is inserted as a second layer 2 (hereinafter referred to as a specific layer)

between the host layers 1, i.e., $Mg_{0.5}Zn_{0.29}Cd_{0.21}Se$ layers (10 ML (atomic layer) thickness) each being lattic matched to the InP substrate.

Figure 2:
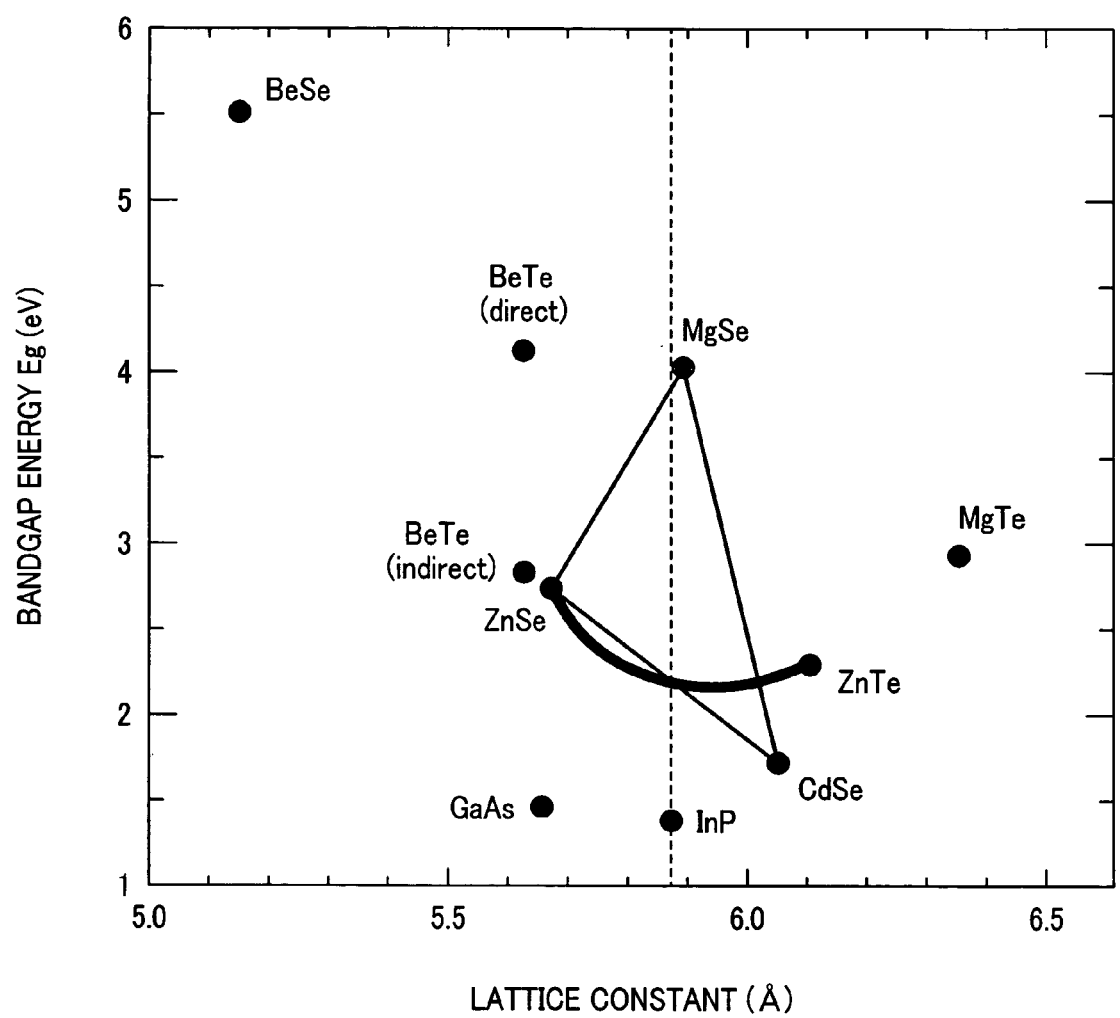
FIG. 2 is a graphical representation explaining the present invention and showing a relationship between an energy gap and a lattice constant of an associated compound semiconductor.

FIG. 2 is a graphical representation showing a relationship between a lattice constant and an energy gap (band gap width) with respect to main materials of the present invention. A lattice matching portion for InP is indicated by a dotted line. For example, the composition ratios x and y of $Mg_xZn_yCd_{1-x-y}Se$ are set within a triangle surrounding ZnSe, CdSe and MgSe, whereby it is possible to manufacture MgZnCdSe which has an arbitrary lattice constant and an energy gap.

Moreover, in FIG. 2, a line segment is drawn between ZnSe and ZnTe. The composition ratio z of $ZnSe_zTe_{1-z}$ is set, whereby it is possible to manufacture $ZnSe_{0.53}Te_{0.47}$ which is lattice matched to InP.

In the specimen structure manufactured as shown in FIG. 1, a $ZnSe_{0.53}Te_{0.47}$ layer as the specific layer 2 was inserted between the $Mg_{0.49}Zn_{0.29}Cd_{0.22}Se$ layers as the host layers 1 each having the energy gap of 2.95 eV and the p-type carrier concentration was then measured. As a result, the carrier concentration of $2.1 \times 10^{18}$ cm$^{-3}$ was obtained.

In FIG. 1, the $ZnSe_{0.53}Te_{0.47}$ layer which is lattice matched to lattice the InP substrate was used as the specific layer 2 to be inserted. However, ZnTe and BeTe each of which does not make the lattice matching, ZnSeTe which does not make the lattice matching, or MgZnSeTe and BeZnTe each of which is formed irrespective of the lattice matching, may be employed. When any of the materials, which does not make the lattice matching, is employed, misfit dislocation occurs due to the magnitude of the mismatch if a layer thickness of the material concerned is set equal to or larger than a critical thickness. For this reason, the layer thickness of the material concerned must be set equal to or smaller than the critical thickness of several atomic layers or less.

Experiments have shown that the high p-type carrier concentration of $1 \times 10^{18}$ cm$^{-3}$ or more is obtained in the semiconductor layer able to become each of these specific layers 2 through the radical nitrogen doping. Here, ZnTe is described in a literature of I. W. Tao et al.: Appl. Phys. Lett., 64, 1848 (1994). ZnSeTe is described in a literature of W. Shinozaki et al.: Jpn. J. Appl. Phys., 38, p. 2598 (1998). MgZnSeTe is described in a literature of W. Faschinger et al.: Appl. Phys. Lett., 65, 3215 (1994). BeZnTe is described in a literature of S. B. Che: J. Cryst. Growth, 214/215, p. 321 (2000). Also, each of ZnSeTe, MgZnSeTe and BeZnTe other than ZnTe and BeTe can be lattice matched to InP. Thus, when each of them is inserted as a heavily doped crystal between the host crystals, a high-quality crystal is obtained which is lattice matched to the InP substrate in terms of the overall crystal.

Although the host layer 1 shown in FIG. 1 is made of MgZnCdSe, the host layer 1 may also be made of MgZnSeTe. In addition, each of a BeZnCdSe layer and a BeZnSeTe layer may also be employed as the host layer 1. However, in this case, the energy gap of the BeZnCdSe layer becomes equal to or smaller than 2.6 eV, and the energy gap of the BeZnSeTe layer becomes equal to or smaller than 2.8 eV. Hence, if the optical element or the like, for example, is manufactured, the design and manufacturing must be made based on the judgment whether or not each of these compound semiconductor materials is effective in confinement of the carriers in consideration of the numeric value of the energy gap of the active layer.

Insertion of each specific layer 2 between the host layers is repeatedly performed plural times while the layer thickness of each host layer 1 and the layer thickness of each specific layer 2 are constant. However, the layer thickness of each host layer 1 and the layer thickness of each specific layer 2 may also be set periodically or at random. For example, when the MgZnCdSe layer having the energy gap of 2.95 eV is used as the host layer 1, the following procedure may also be adopted. That is to say, the ZnSeTe layer with a thickness of 1 ML is inserted as the specific layer 2. Next, after the MgZnCdSe layer as the host layer 1 is laminated thereon, the ZnSeTe layer with a thickness of 2 ML is inserted as the specific layer 2. Moreover, the layer thickness of the specific layer after lamination of the host layer 1 is set to a 3 ML thickness.

Figure 3:
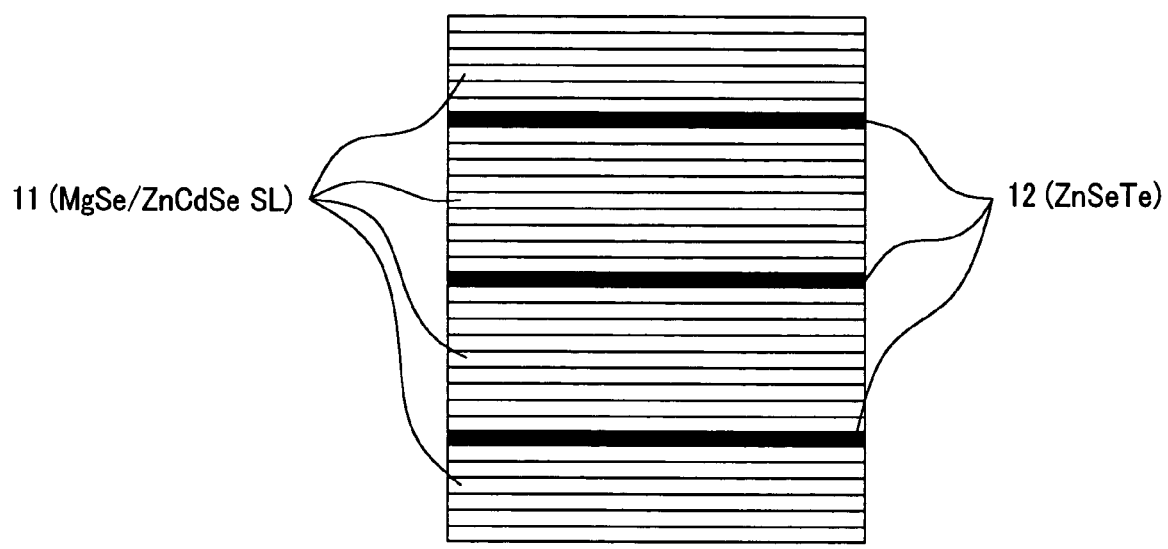
FIG. 3 is a second conceptual schematic view of the present invention.

FIG. 3 is a second conceptual schematic view of the embodiment mode of the present invention. Here, a host layer 11 is made in the form of a superlattice layer made of MgSe/ZnCdSe. The MgSe/ZnCdSe superlattice has a structure in which an MgSe thin film crystal and a ZnCdSe thin film crystal are alternately laminated. Thus, the layer thickness of each layer is set in the range, of several angstroms to several nanometers, which is equal to or smaller than wavelength of a de Broglie wave of an electron, whereby the MgSe/ZnCdSe superlattice can be regarded as a pseudo $Mg_xZn_yCd_{1-x-y}Se$ mixed crystal. The overall structure is doped with a p-type dopant.

In addition, the lattice constant (5.91 Å) of MgSe is close to that (5.869 Å) of InP, and ZnCdSe can be lattice matched to InP. Thus, since the MgSe/ZnCdSe superlattice can be manufactured while artificially being lattice matched to InP, a high quality crystal can be obtained.

In the MgSe/ZnCdSe superlattice, the physical property parameters such as the band gap width can be controlled while the lattice matching with InP is maintained by changing the layer thicknesses of MgSe and ZnCdSe, which offers the same effect as that in the case where the composition ratios (x, y) of $Mg_xZn_yCd_{1-x-y}Se$ are changed.

Actually, changing the layer thickness of the MgSe/ZnCdSe superlattice is remarkably easier than changing the composition ratios of $Mg_xZn_yCd_{1-x-y}Se$ from a viewpoint of crystal growth. The MgSe/ZnCdSe superlattice is a very effective material when a complicated hetero structure in the semiconductor device is manufactured. This is described in a literature of H. Shimbo et al.: J. Cryst. Growth, 184/185, 16 (1998).

On the other hand, in FIG. 3, the specific layer 12 to be inserted is made of ZnSeTe. However, the specific layer 12 may also be made of any of ZnTe, BeTe, MgZnSeTe and BeZnTe. The experiments have shown that the high p-type carrier concentration of $1 \times 10^{18}$ cm$^{-3}$ or more is obtained from each of these crystals through the radical nitrogen doping. Here, ZnTe is described in the literature of I. W. Tao et al.: Appl. Phys. Lett., 64, 1848 (1994). ZnSeTe is described in the literature of W. Shinozaki et al.: Jpn. J. Appl. Phys., 38, p. 2598 (1998). MgZnSeTe is described in the literature of W. Faschinger et al.: Appl. Phys. Lett., 65, 3215 (1994). BeZnTe is described in the literature of S. B. Che: J. Cryst. Growth, 214/215, 321 (2000).

Also, each of ZnSeTe, MgZnSeTe and BeZnTe other than ZnTe and BeTe can be lattice matched to InP. Thus, when any of them is inserted as a heavily doped crystal between the host crystals, a high-quality crystal can be obtained which is lattice matched to the InP substrate in terms of the overall crystal.

On the other hand, ZnTe has a lattice constant of 6.10 Å and thus has lattice mismatching with InP (its lattice constant is 5.869 Å) by +3.9%. Thus, the insertion of ZnTe between the host crystals each being lattice matched to the InP substrate may cause a crystal defect to be generated due to a crystal strain. However, the layer thickness of ZnTe is set equal to or smaller than the critical thickness with which the misfit dislocation is prevented from being generated, and also the lattice constant of the host crystal layer is intentionally made smaller than that of InP so as to obtain the negative lattice mismatching, thereby providing the net zero strain for the overall crystal. As a result, that lattice mismatching of +3.9% can be solved. Hence, the condition for providing the net zero strain is expressed by Expression (1):

$$\epsilon_h(1-\gamma_p)+\epsilon_p\gamma_p=0 \qquad \text{(Expression (1))}$$

where $\epsilon_h$ is the amount of strains of a host crystal, $\epsilon_p$ is the amount of strains of a heavily doped layer, and $\gamma_p$ is a layer thickness ratio of the heavily doped layer to the overall crystal.

Thus, when the heavily doped layer is made of ZnTe and its layer thickness ratio is set to 0.1, the crystal strain of the host layer must be made −0.433% in order to obtain the net zero strain. This can be made in MgZnCdSe or ZnCdSe by controlling the composition ratios. Thus, even when ZnTe having the large lattice strain is employed, a high-quality crystal can be obtained by use of the technique for providing the net zero strain.

Although, in FIG. 3, the host layer 11 is made in the form of the MgSe/ZnCdSe superlattice layer, MgZnSe or MgZnSeTe may also be employed instead of MgSe.

Furthermore, in FIG. 3, although the host layer 11 is made in the form of the MgSe/ZnCdSe superlattice layer, ZnSeTe, BeZnCdSe, BeZnSeTe, MgZnCdSe or MgZnSeTe may also be employed instead of ZnCdSe.

In the present invention, each specific layer 12 is inserted at suitable intervals between the host layers 11, whereby the p-type carriers (holes) are discharged from the specific layers 12 to the host layers 11, and thus the sufficient hole concentration of $1\times10^{17}$ cm$^{-3}$ or more can be obtained in the overall crystal. The specific layer 12 is thinner than the host layer 11 and its rate of the specific layer 12 to the overall crystal is small. Hence, the insertion of each specific layer 12 hardly exerts an influence on the physical property parameters such as the energy gap of the host layer 11 or this influence is suppressed to a minimum.

Figure 4A:
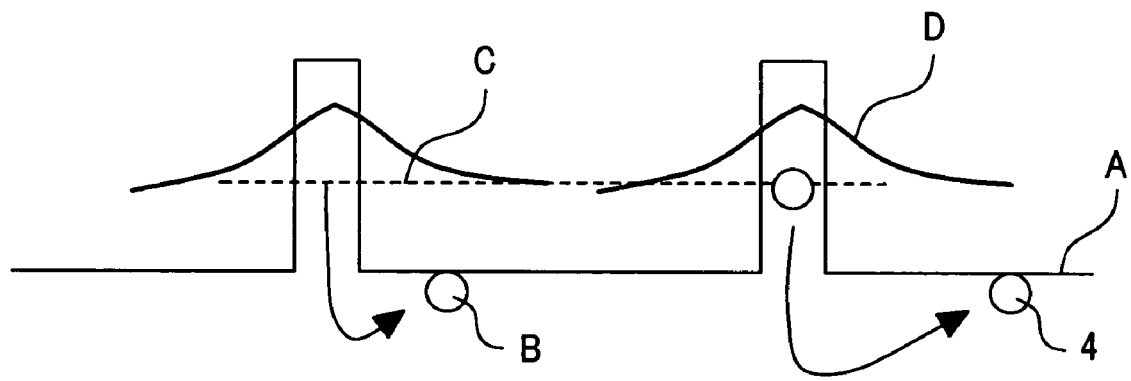
FIGS. 4A and 4B are diagrams schematically showing a valence band structure of a semiconductor in which each specific layer is inserted between host layers, i.e., diagram explaining a theoretical ground of the present invention and schematically showing a valence band structure of a quantum well obtained by inserting each specific layer between the host layers, a p-type carrier (hole) existing therein, and a wave function and an energy level of the p-type carrier.
Figure 4B:
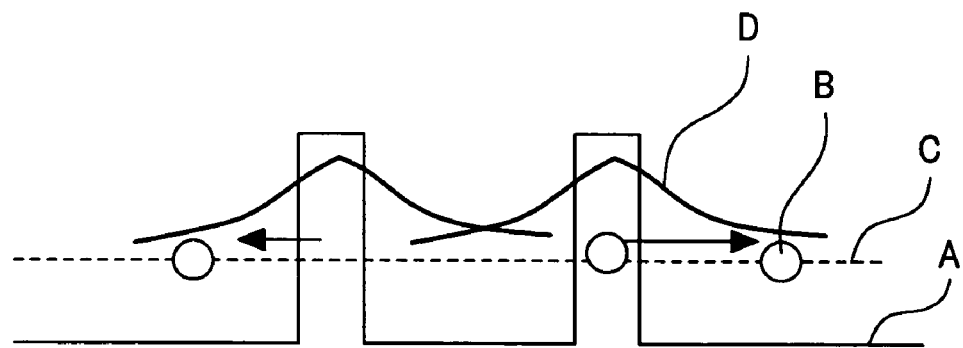

Normally, in the semiconductor doped with the p-type dopant, an acceptor level is formed in the vicinity of an upper end of a valence band, and the holes are discharged from the acceptor level. As a result, the semiconductor doped with the p-type dopant shows the p-type conductivity. Here, two kinds of mechanisms for obtaining the p-type doping in accordance with the present invention are expected. Their conceptual diagrams are shown in FIGS. 4A and 4B. FIGS. 4A and 4B are diagrams schematically showing a valence band structure of semiconductors in which each specific layer is inserted between host layers, i.e., diagrams explaining a theoretical ground of the present invention and schematically showing valence band structures of quantum wells obtained by inserting each specific layer between the host layers, p-type carriers (holes) existing therein, and wave functions and energy levels of the p-type carriers. Here, reference symbol A designates a valence band structure of a quantum well structure in the host crystal and the heavily doped crystal. Reference symbol B designates a p-type carrier (hole). Reference symbol C designates an energy quantum level, in the quantum well, of the p-type carrier (hole). Also, reference symbol D designates a wave function of the p-type carrier (hole) confined within the quantum well.

As shown in FIGS. 4A and 4B, in a combination of the host layer and specific layer described above, the valence band structure shows the quantum well structure in which the specific layer becomes a well layer and the host layer becomes a barrier layer from a band relationship of these semiconductor crystals. In addition, a thickness of the inserted specific layer falls within the range of about several angstroms to about several nanometers or less. The quantum level of the holes, as shown in FIGS. 4A and 4B, is formed within the quantum well.

With regard to the first mechanism for obtaining the p-type conductivity in accordance with the present invention, it is considered that as shown in FIG. 4A, the hole is thermally excited from the high concentration acceptors in the specific layer to the valence band of the host layers to behave as a free carrier (hole), and thus the p-type conductivity is obtained as a whole. At this time, the concentration of the holes excited to the valence band of the host crystals is approximately proportional to exp(−Ea/kT), where Ea is an activation energy, k is a Boltzmann's constant, and T is an absolute temperature. Here, it is considered that the concentration of the excited holes decreases as compared with that in the specific layer as the well layer since the activation energy increases in correspondence to the energy of the barrier layer. For example, when an increase in activation energy is 0.12 eV, it is estimated that the hole concentration at a room temperature (T=300 K) decreases to about 1/100. However, when the hole concentration obtained from the heavy doping is $1\times10^{20}$ cm$^{-3}$, the concentration of the excited holes becomes $1\times10^{18}$ cm$^{-3}$. Thus, it is expected that the sufficient value is obtained for the application to the device. Consequently, it is considered that the conversion of the conductivity to the p-type conductivity by this mechanism is effective when a well barrier height (energy) of the specific layer with respect to the host layer is equal to or smaller than about 0.12 eV or less.

With regard to the second mechanism, as shown in FIG. 4B, it is considered that the wave function of the hole confined in each well layer overlaps the wave function of the hole in the adjacent well layer to form a mini band, and the hole is excited to the mini band, thereby showing the p-type conductivity. In this case, a limit to the well barrier height in the first mechanism is relaxed, and thus the high hole concentration is expected as long as the energy level of the formed mini band is sufficiently low even in the deeper well structure. Since the energy level of the mini band depends on the thicknesses of the well layer and the barrier layer, it can be artificially controlled so as to fall within a certain range.

A first embodiment of the present invention will be described below. A specimen shown in FIG. 5A was manufactured, and its characteristics were evaluated.

Figure 5A:
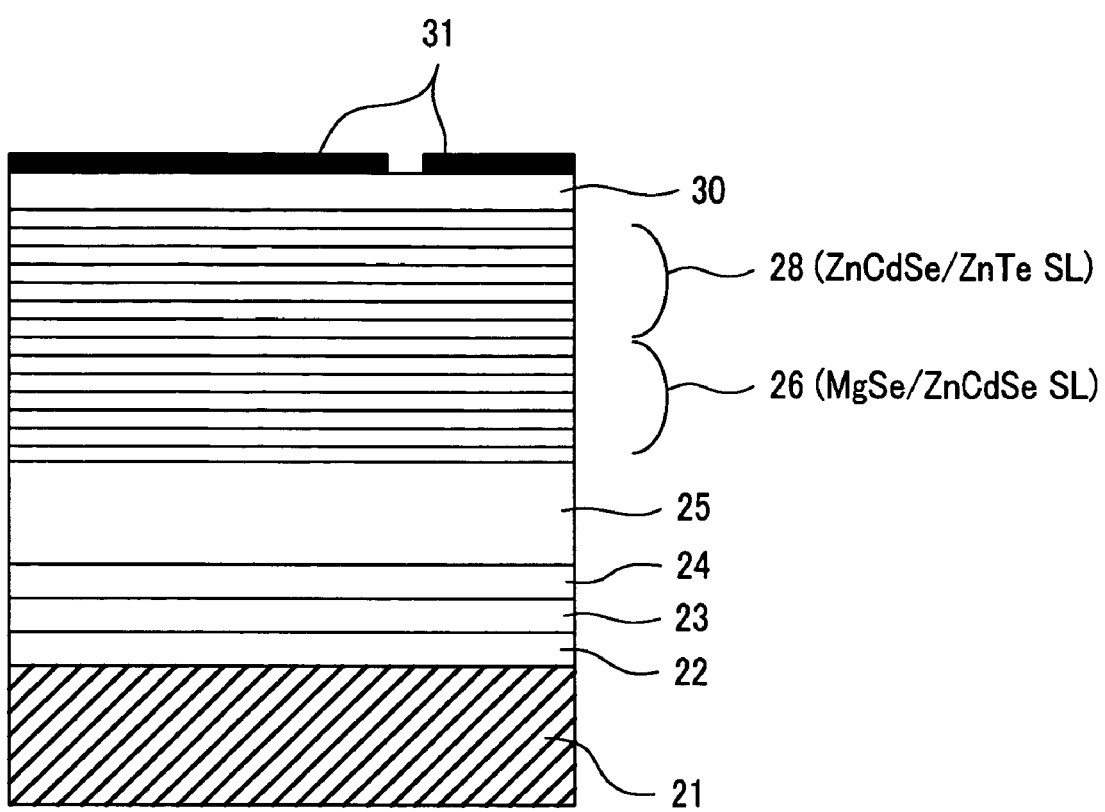
FIG. 5A is a cross sectional view explaining a lamination structure of a host layer and specific layers which have respective given thicknesses according to a first embodiment of the present invention.

A crystal of the specimen shown in FIG. 5A was grown by using a 2-growth chamber molecular beam epitaxy (MBE) system. First, an InP substrate 21, after being subjected to the optimal surface treatment, was placed within the MBE system. The InP substrate 21 was then placed in a preparatory chamber for specimen exchange, air therein was vacuumed by a vacuum pump, until a pressure of $10^{-3}$ Pa or less was obtained, and the InP substrate 21 was heated up to 100° C. to desorb residual moisture and an impurity gas.

Next, the InP substrate 21 was conveyed to a III-V dedicated growth chamber, and was heated at a substrate temperature of 500° C. while a P molecular beam is applied to the surface of the InP substrate 21, thereby removing an oxide film formed on the surface of the InP substrate 21. After that, an InP buffered layer 22 was grown to be 30 nm thick at the substrate temperature of 450° C., and an InGaAs buffered layer 23 was then grown to be 0.1 μm thick at the substrate temperature of 470° C.

Next, the specimen was conveyed to a II-VI dedicated growth chamber, and a ZnCdSe low temperature buffered layer 24 was grown to be 5 nm thick at the substrate temperature of 200° C. while a Zn molecular beam is applied thereto.

After that, a ZnCdSe buffered layer 25 (having a thickness of 100 nm) and an MgSe/ZnCdSe superlattice 26 (an MgSe layer with a thickness of 0.6 nm, a ZnCdSe layer with a thickness of 1.71 nm, 57 cycles, and a total thickness of 0.13 μm) were successively formed on the ZnCdSe buffered layer 25 at the substrate temperature of 280° C. Then, a superlattice structure 28 (its total thickness was 0.5 μm) according to the present invention was formed in which host layers and specific layers to be inserted were combined with each other. Finally, a ZnTe layer 30 (its thickness was 5 nm) was formed on the superlattice structure 28. In this embodiment, in the superlattice structure 28, each host layer was made of ZnCdSe, and each specific layer was made of ZnTe. The ZnCdSe layer having a thickness of 3.96 nm, and the ZnTe thin film layer having a thickness of 0.73 nm were alternately laminated 110 times, thereby obtaining a ZnCdSe/ZnTe superlattice structure. At this time, the superlattice structure 28 was grown while being subjected to radical nitrogen doping under the conditions in which a nitrogen flow rate was 0.015 sccm, an RF output was 400 W, a growth temperature was 280° C., and a VI/II ratio was about 1.

In a preliminary experiment made prior to this experiment, the specimen was obtained such that a ZnTe single layer film was grown while being subjected to the radical nitrogen doping under the same condition as those of the foregoing, and a p-type carrier concentration of the specimen was measured. As a result, the high p-type carrier concentration of $5 \times 10^{20}$ cm$^{-3}$ was confirmed.

Next, Ti and Al were evaporated and were patterned through optical exposure with a photo resist as a mask, thereby forming Schottky type two electrodes 31 as shown in FIG. 5A. A measurement utilizing a capacitance-voltage (C-V) method was performed at the room temperature by using these electrodes 31 to obtain an effective acceptor (p-type doping) concentration in the MgZnCdSe/ZnTe superlattice layer.

Figure 6:
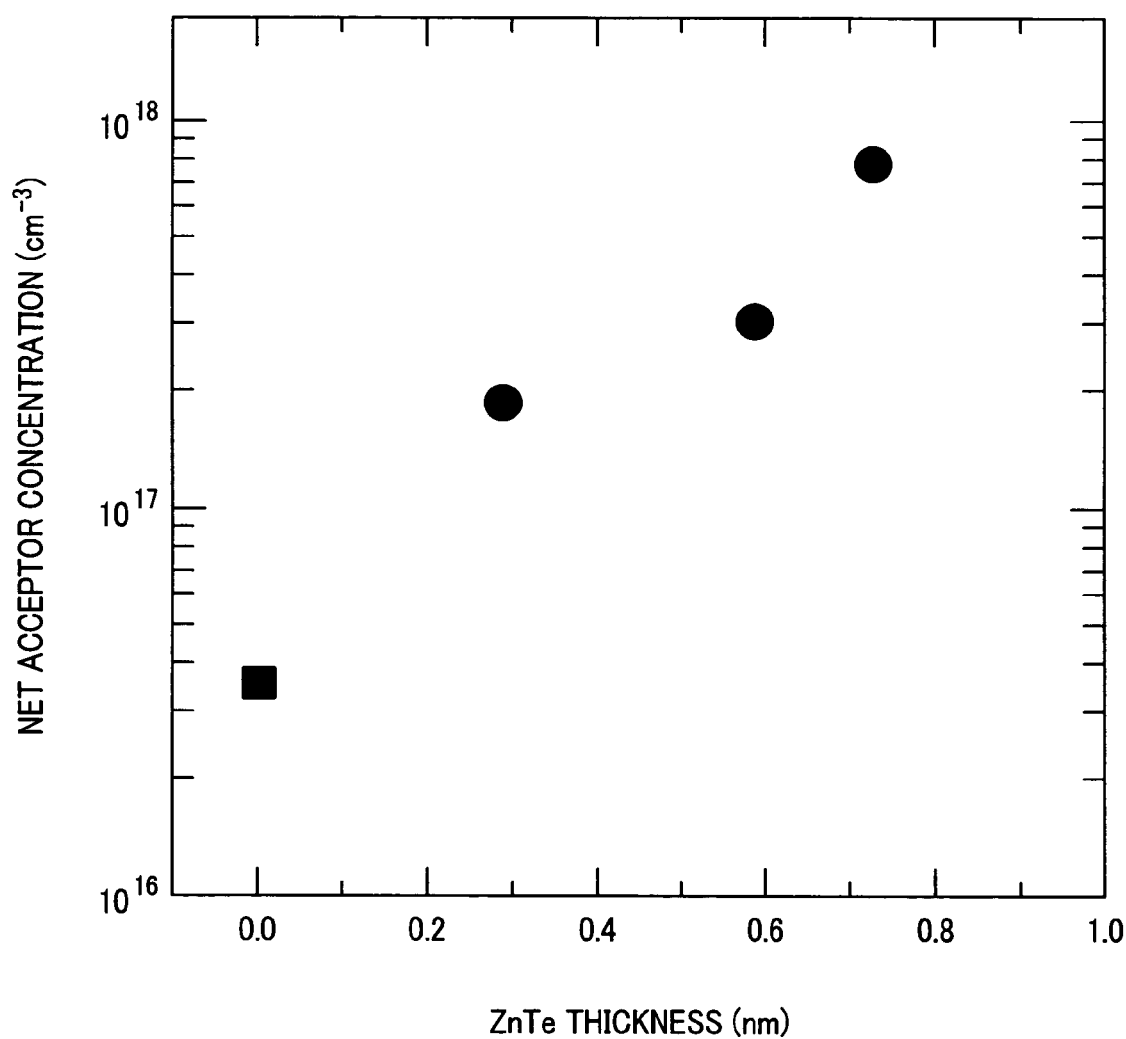
FIG. 6 is a graphical representation showing a relationship between an effective acceptor concentration and a ZnTe layer thickness for one cycle of a superlattice with respect to a ZnCdSe/ZnTe superlattice which is obtained in the first embodiment of the present invention.

FIG. 6 shows a relationship between the resulting effective acceptor concentration and a ZnTe layer thickness. In FIG. 6, a value of the effective acceptor concentration in a ZnCdSe single layer film is shown, described in a literature of K. Naniwae et al.: J. Cryst. Growth, 184/183, 450 (1998), when the ZnTe layer thickness is zero. As can be seen from FIG. 6, the ZnCdSe single layer film has the low effective acceptor concentration of $3.5 \times 10^{16}$ cm$^{-3}$, whereas the insertion of each ZnTe thin film results in that a high carrier concentration of $8 \times 10^{17}$ cm$^{-3}$ is obtained.

The thicknesses of the ZnTe specific layer of the superlattice structure 28 as the ZnCdSe/ZnCe superlattice layer were set to 0.29 nm and 0.59 nm, the specimens each having the same structure as that shown in FIG. 5A were manufactured and their characteristics were evaluated. As a result, $1.9 \times 10^{17}$ cm$^{-3}$ and $3.1 \times 10^{17}$ cm$^{-3}$ were obtained as the carrier concentration from these specimens, respectively.

That is, when the ZnTe layer thickness was 0.73 nm, the carrier concentration was $8 \times 10^{17}$ cm$^{-3}$. Thus, the high concentration doping was attained which was 20 or more times as large as $3.5 \times 10^{16}$ cm$^{-3}$ in the case of the p-type ZnCdSe single layer film. The higher carrier concentration can be expected by optimizing the growth conditions.

Moreover, each specific layer of the superlattice structure 28 is made of ZnSeTe which is smaller in valence band energy discontinuous value than ZnTe, whereby it becomes possible to readily take out the carriers from each specific layer. This results in that a resistance of the p-type cladding layer can be reduced.

In addition, the effective acceptor concentration of the superlattice structure 28 is shown above, which is obtained from the lamination structure of the host layers and the specific layers which have respective given film thicknesses. However, the experimental results shown in FIG. 6 suggest that the present invention can also be applied to the structure with modulated film thickness in which the film thicknesses of both the layers are changed at random or regularly. Such application examples will be described below.

Figure 5B:
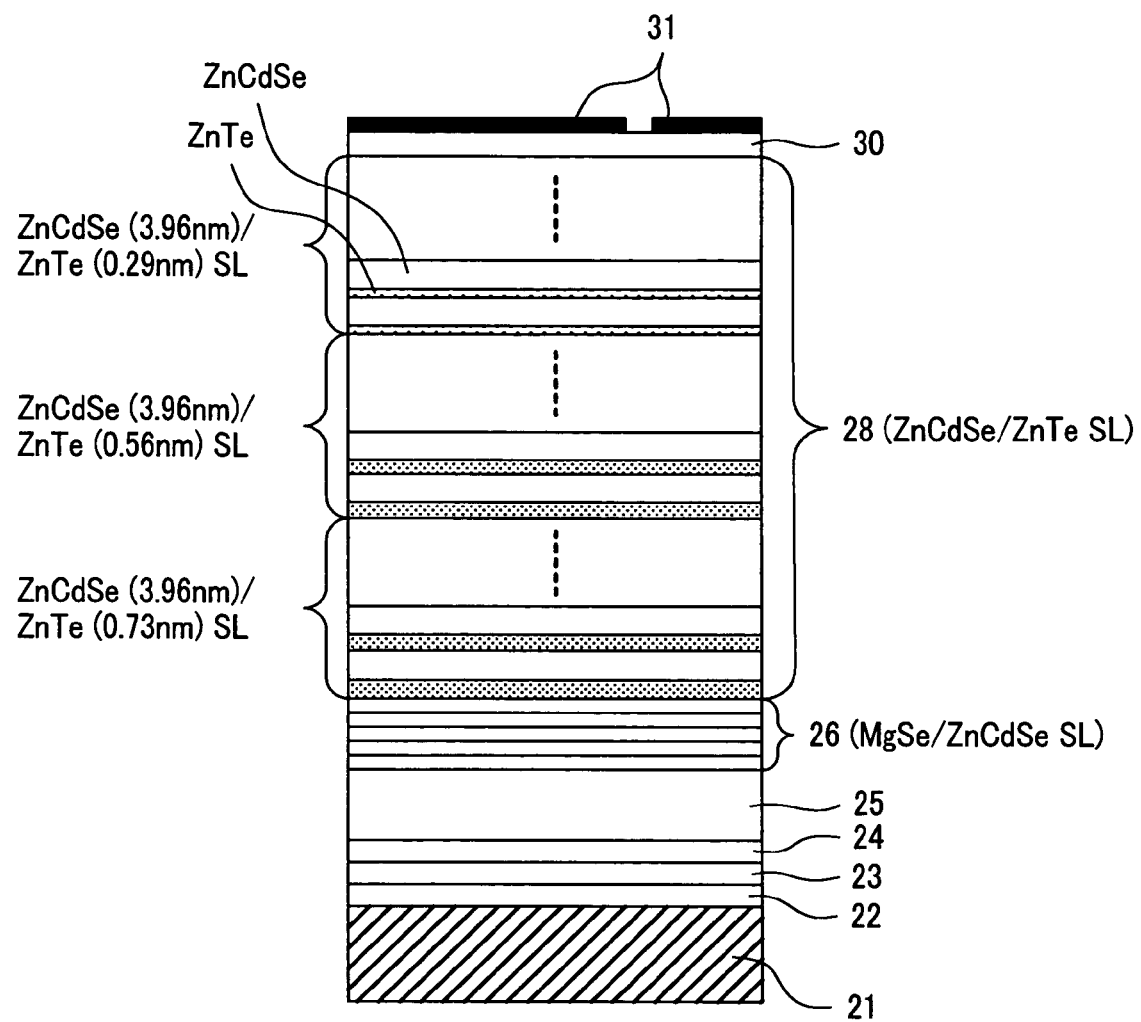
FIG. 5B is a cross sectional view explaining a lamination structure as a structure with layer thicknesses modulated in which thicknesses of the host layer and the specific layer are regularly changed in the first embodiment of the present invention.

FIG. 5B is a cross sectional view showing an application example to a structure with modulated film thickness in which both the film thicknesses are regularly changed. The specific layers having different film thicknesses (e.g., the ZnTe layers having thicknesses of 0.29 nm, 0.56 nm and 0.73 nm) are successively laminated on the host crystal having a given film thickness (e.g., the ZnCdSe crystal layer having a thickness of 3.96 nm) of the superlattice structure 28 by a suitable number of layers. As a result, the superlattice structure 28 can be given a gradient of the carrier concentration while the high carrier concentration is maintained in a film thickness direction. Thus, the application becomes possible in which the laser diode can be given the degree of freedom for design about the optical confinement and the carrier absorption loss. Other structures of FIG. 5B are the same as those shown in FIG. 5A.

In addition, other application examples are shown in parts (a) to (d) of FIG. 7A. The part (a) of FIG. 7A is a cross sectional view showing a concrete example of the superlattice stricture 28 shown in FIG. 5A for comparison with other examples. Each host layer is made of ZnCdSe, and each specific layer is made of ZnTe. A thickness of each specific layer is 3 ML (atomic layer).

The part (b) of FIG. 7A shows an example in which each specific layer having a thickness of 3 ML is divided into three thin film layers each having a thickness of 1 ML, and each MgZnCdSe layer, which is a host layer, having a thickness which is nearly equal to or larger than that of each thin film layer is inserted between the thin film layers. The host layer (made of MgZnCdSe) subjected to the division is thinned (e.g., into 2 ML), whereby it is possible to control the energy position of the mini band formed between the specific layers. As a result, the energy position of the mini band can be made close to the valence band of the host layer as compared with the quantum level obtained from the structure shown in the part (a) of FIG. 7A. In addition, the holes can be more readily taken out from the specific layers to the host layers, and the resistance of the p-type cladding layer including the specific layer and the host layer can be reduced.

The part (c) of FIG. 7A shows an example in which an intermediate layer (made of MgZnCdSeTe) with the composition ratios continuously changed is introduced into an interface between the specific layer (made of ZnTe) having a thickness of 3 ML and the host layer (made of MgZnCdSe). With this structure, it is possible to improve the hole movement in a direction perpendicular to the lamination direction. Thus, it is possible to reduce the resistance of the p-type cladding layer according to the present invention. This effect can also be obtained in the structure in which a structure of a superlattice with layer thicknesses modulated is employed as an intermediate portion between the specific layer and the host layer as shown in the part (d) of FIG. 7A. That is, in the example shown in the part (d) of FIG. 7A, the specific layer (made of ZnTe) having a thickness of 1 ML, the host layer (made of MgZnCdSe) having a thickness of 2 ML, the specific layer (made of ZnTe) having a thickness of 2 ML, and the host layer (made of MgZnCdSe) having a thickness of 1 ML are successively laminated on the host layer (made of MgZnCdSe), and also the specific layer (made of ZnTe) having a thickness of 3 ML is further laminated thereon. As a result, the layer is structured, which is equal to the intermediate layer, having the continuously changing composition ratios, and which is introduced into the interface between the specific layer (made of ZnTe) and the host layer (made of MgZnCdSe). An advantage of this structure is that the crystal is easy to grow since the overall p-type cladding layer is structured by employing the two kinds of crystals, i.e., the host layer and the specific layer. In this case, the thicknesses of the layers each having the same composition ratio as that of the specific layer are successively decreased as the layers having the same composition ratio are positioned away from the specific layer to the host layer. At the same time, the thicknesses of the layers each having the same composition ratio as that of the host layer are successively increased as the layers having the same composition ratio are positioned away from the specific layer to the host layer. Thus, the superlattice with modulated thickness of the intermediate portion operates as if it is a pseudo mixed crystal, and acts as the layer having effectively the same band structure as that of the intermediate layer, having the continuously changing composition ratio, which is introduced into the interface therebetween. As a result, the resistance of the p-type cladding layer can be reduced similarly to the example shown in the part (c) of FIG. 7A. In this case, although the superlattice with layer thicknesses modulated including the four layers is shown, it is also possible to employ the intermediate layer of the superlattice with layer thicknesses modulated including the additional layers.

Parts (a) to (d) of FIG. 7B are respectively energy diagrams showing energies, in the lamination direction, which are obtained from the lamination structures shown in the parts (a) to (d) of FIG. 7A, respectively. In an example shown in the part (b) of FIG. 7B, the energy position of the mini band is made close to the valence band of the host layer as compared with the quantum level (indicated by a dashed line) shown in the part (a) of FIG. 7B, which results in that the holes can be more readily taken out from the specific layers to the host layers. Thus, it is possible to reduce the resistance of the p-type cladding layer including the specific layers and the host layers. In an example shown in the part (d) of FIG. 7B, the lamination structure effectively acts as the layer having a band structure as indicated by a dashed line. As a result, it is possible to reduce the resistance of the p-type cladding layer similarly to the example shown in the part (c) of FIG. 7B.

A second embodiment of the present invention will be described below. Specimens shown in FIGS. 8A and 8B were manufactured, and their characteristics were evaluated.

The specimen shown in FIG. 8A will now be described. The specimen was manufactured through the crystal growth by using the 2-growth chamber molecular beam epitaxy (MBE) system. An InP substrate 21, after having been subjected to the optimal surface treatment, was placed within the MBE system. The InP substrate 21 was then placed in a preparatory chamber for specimen exchange, air therein was vacuumed by a vacuum pump, until a pressure of $10^{-3}$ Pa or less was obtained, and the InP substrate 21 was heated up to 100° C. to desorb residual moisture and an impurity gas.

Next, the Inp substrate 21 was conveyed to a III-V dedicated growth chamber, and was heated at a substrate temperature of 500° C. while a P molecular beam is applied to the surface of the Inp substrate 21, thereby removing an oxide film formed on the surface of the InP substrate 21. After that, an InP buffered layer 22 was grown to be 30 nm thick at the substrate temperature of 450° C., and an InGaAs buffered layer 23 was then grown to be 0.1 µm thick at the substrate temperature of 470° C.

Next, the specimen was conveyed to a II-VI dedicated growth chamber, and a ZnCdSe low temperature buffered layer 24 was grown to be 5 nm thick at the substrate temperature of 200° C. while a Zn molecular beam is applied thereto. After that, a ZnCdSe buffered layer 25 (having a thickness of 100 nm) was grown at the substrate temperature of 280° C. Next, four layers (indicated by U1 in the figure) consisting of a ZnTe layer 34 (0.73 nm), a ZnCdSe layer 35 (1.98 nm), an MgSe layer 36 (0.59 nm) and the ZnCdSe layer 35 (1.98 nm) were laminated by 110 cycles, where one cycle has the four layers. The resulting superlattice structure was subjected to the p-type doping using the radical nitrogen under the above-mentioned conditions. Here, the host layer was a superlattice layer including a three-layers structure consisting of the ZnCdSe layer 35, the MgSe layer 36 and the ZnCdSe layer 35. The specific layer was the ZnTe layer 34.

In a preliminary experiment made prior to this experiment, the specimen was obtained such that a ZnTe single layer film was grown while being subjected to the radical nitrogen doping under the same condition as those of the foregoing, and a p-type carrier concentration of the specimen was measured. As a result, the high p-type carrier concentration of $5\times10^{20}$ cm$^{-3}$ was confirmed.

Next, Ti and Al were evaporated and patterned through optical exposure with a photo resist as a mask, thereby forming Schottky type two electrodes 31 as shown in FIG. 8A. The measurement with use of the capacitance-voltage (C-V) method was performed at the room temperature by using these electrodes 31 to obtain an effective acceptor (p-type doping) concentration in the MgSe/ZnCdSe/ZnTe superlattice layer.

FIG. 9 is a graphical representation showing a relationship between an effective acceptor concentration and an MgSe thickness for one cycle in an MgSe/ZnCdSe/ZnTe superlattice in the second embodiment of the present invention. Here, the MgSe thickness is the total thickness of the MgSe layer for one cycle of the superlattice. A plot (a) shown in FIG. 9 is the result of the evaluation for the specimen described above. The case where the MgSe thickness shown in FIG. 9 is zero corresponds to the case of the ZnCdSe (its thickness is 3.96 nm)/ZnTe (its thickness is 0.73 nm) superlattice in the first embodiment of the present invention.

With the structure shown in FIG. 8A, a specimen in which only the thickness of the MgSe layer 36 was increased from 0.59 nm to 1.17 nm was manufactured, and the evaluation result thereof is added as a plot (b) to FIG. 9.

Next, a specimen shown in FIG. 8B will now be described. This specimen is a modification of the second embodiment of the present invention, and the characteristic thereof is added as a plot (c) to FIG. 9. A crystal of the specimen shown in FIG. 8B was grown by using a 2-growth chamber molecular beam epitaxy (MBE) system. First, an InP substrate 21, after being subjected to the optimal surface treatment, was placed within the MBE system. The InP substrate 21 was then placed in a preparatory chamber for specimen exchange, air therein was vacuumed by a vacuum pump, until a pressure of $10^{-3}$ Pa or less was obtained. The InP substrate 21 was heated up to 100° C. to desorb residual moisture and an impurity gas.

Next, the InP substrate 21 was conveyed to a III-V dedicated growth chamber, and heated at a substrate temperature of 500° C. while a P molecular beam is applied to the surface of the InP substrate 21, thereby removing an oxide film formed on the surface of the InP substrate 21. After that, an InP buffered layer 22 was grown to be 30 nm thick at the substrate temperature of 450° C., and an InGaAs buffered layer 23 was then grown to be 0.1 µm thick at the substrate temperature of 470° C.

Next, the specimen was conveyed to a II-VI dedicated growth chamber, and a ZnCdSe low temperature buffered layer 24 was grown to be 5 nm thick at the substrate temperature of 200° C. while a Zn molecular beam is applied thereto. After that, a ZnCdSe buffered layer 25 (having a thickness of 100 nm) was grown at the substrate temperature of 280° C. Next, six layers (indicated by U2 in the figure) consisting of an ZnTe layer 41 (0.73 nm), a ZnCdSe layer 42 (1.03 nm), an MgSe layer 43 (0.88 nm), a ZnCdSe layer 44 (1.91 nm), the MgSe layer 43 (0.88 nm), and the ZnCdSe layer 42 (1.03 nm) were laminated by 110 cycles, where one cycle has the six layers. Finally, a ZnTe layer (5 nm) was laminated thereon. That is, the host layer was the MgSe/ZnCdSe superlattice layer, and the specific layer was the ZnTe layer. The p-type doping using the radical nitrogen was performed under the above-mentioned conditions.

With the structure shown in FIG. 8B, a specimen in which only the thickness of the MgSe layer 43 was increased from 0.88 nm to 1.17 nm was manufactured, and the evaluation result thereof is added as a plot (d) to FIG. 9.

It is understood from FIG. 9 that the effective acceptor concentration of $4\times10^{17}$ cm$^{-3}$ or more is obtained in any of the MgSe thicknesses. On the other hand, as the MgSe thickness is increased, the effective acceptor concentration decreases. In this case, the effective acceptor concentration is shown with respect to the lamination structure including the host layers and the specific layers which have respective given thicknesses. However, the results shown in FIG. 9 also suggest applications to the structure with layer thicknesses modulated. That is to, it is possible to make modifications which are the same as those shown in FIG. 5B and the parts (a) to (d) of FIG. 7A and which are made for the structure shown in FIG. 5A. For example, it is also possible to adopt a structure or the like in which the superlattice host layers having different thicknesses are successively laminated by suitable cycles between the ZnTe specific layers having respective given thicknesses (e.g., 0.29 nm, 0.56 nm and 0.73 nm). As a result, the structure with the layer thicknesses modulated can be given a gradient of the carrier concentration while the high carrier concentration is held in the thickness direction. Moreover, it is also possible to make applications of the present invention in which the thicknesses and composition ratios of the host layer and the specific layer are arbitrarily changed. As a result, it is possible to manufacture a graded superlattice structure using an intermediate layer with a composition ratio changed, and it is also possible to manufacture a graded superlattice structure using a pseudo mixed crystal layer in which the thicknesses of the host layers and the specific layers are continuously changed.

Next, surface reflectivity spectra of these specimens were measured, and absorption edges were obtained therefrom to estimate energy gaps (band gap widths). FIG. 10 is a graphical representation showing a relationship between a band gap width and the MgSe thickness for one cycle of the MgSe/ZnCdSe/ZnTe superlattice in the second embodiment of the present invention. Also, FIG. 10 shows dependency of the resulting band gap width on the MgSe layer. As the MgSe thickness is increased from 0 to 2.34 nm, the band gap width increases from 2.08 eV to 2.56 eV. As a result, an increase in band gap width due to insertion of the MgSe layer was confirmed. Even when the band gap width is increased up to 2.56 eV by insertion of the MgSe layer, the p-type carrier concentration of $4.5\times10^{17}$ cm$^{-3}$ or more is obtained.

A third embodiment of the present invention will now be described. A specimen shown in FIG. 11 was manufactured and its characteristics were evaluated. A crystal of the specimen shown in FIG. 11A was grown by using a 2-growth chamber molecular beam epitaxy (MBE) system. First, an S-doped InP substrate 21, after being subjected to the optimal surface treatment, was placed within the MBE system. The InP substrate 21 was then placed in a preparatory chamber for specimen exchange, air therein was vacuumed by a vacuum pump, until a pressure of $10^{-3}$ Pa or less was obtained, and the InP substrate 21 was heated up to 100° C. to desorb residual moisture and an impurity gas.

Next, the InP substrate 21 was conveyed to a III-V dedicated growth chamber, and heated at a substrate temperature of 500° C. while a P molecular beam is applied to the surface of the InP substrate 21, thereby removing an oxide film formed on the surface of the InP substrate 21. After that, an InP buffered layer 22 was grown to be 30 nm thick at the substrate temperature of 450° C., and an InGaAs buffered layer 23 was then grown to be 0.1 μm thick at the substrate temperature of 470° C.

Next, the specimen was conveyed to a II-VI dedicated growth chamber, and a ZnCdSe low temperature buffered layer 24 was grown to be 5 nm thick at the substrate temperature of 200° C. while a Zn molecular beam is applied thereto. After that, a ZnCdSe buffered layer 25 (having a thickness of 100 nm) was grown at the substrate temperature of 280° C. After that, a superlattice structure was formed in which the host layers 45 according to the present invention and the specific layers 46 were combined with each other. Finally, a ZnTe layer 30 (5 nm) was laminated on the superlattice structure. In this embodiment, each host layer 45 was made of MgZnCdSe, and each specific layer 46 was made of ZnTe. Thus, an MgZnCdSe/ZnTe superlattice structure was obtained in which the MgZnCdSe layer 45 having a thickness of 4.0 nm, and the ZnTe thin film layer 46 having a thickness of 1.0 nm were alternately laminated by 150 pairs. The p-type doping using the radical nitrogen was performed under the above-mentioned conditions.

In a preliminary experiment made prior to this experiment, the specimen was obtained such that a ZnTe single layer film was grown while being subjected to the radical nitrogen doping under the same condition as those of the foregoing, and a p-type carrier concentration of the specimen was measured. As a result, the high p-type carrier concentration of $5\times10^{20}$ cm$^{-3}$ was confirmed.

Next, Ti and Al were evaporated and patterned through optical exposure with a photo resist as a mask, thereby forming Schottky type two electrodes 31 as shown in FIG. 5A. The measurement with use of the capacitance-voltage (C-V) method was performed at the room temperature by using these electrodes 31 to obtain an effective acceptor (p-type doping) concentration in the MgZnCdSe/ZnTe superlattice layer.

FIG. 12 shows a relationship between the resulting effective acceptor concentration and an energy gap. The energy gap of 2.25 eV is obtained in the case of ZnCdSe/ZnTe. As can be seen from FIG. 12, as the energy gap increases, the carrier concentration slightly decreases. However, a considerably high carrier concentration of $2.1\times10^{18}$ cm$^{-3}$ is obtained in the MgZnCdSe/ZnTe superlattice semiconductor layer with a wide energy gap of 2.95 eV. A ZnCdSe single layer, which is shown for comparison, has the carrier concentration of $3.5\times10^{16}$ cm$^{-3}$. Also, any of the p-type layers could not been obtained in a region of the wide band gap. This clearly shows the effectiveness of the present invention aiming at obtaining compatibility of the broadening of the band gap and the high p-type doping.

A fourth embodiment of the present invention will now be described. A semiconductor LD structure shown in FIG. 13A was manufactured. A crystal of the specimen was grown by using a 2-growth chamber molecular beam epitaxy (MBE) system. First, an InP substrate 21, after being subjected to the optimal surface treatment, was placed within the MBE system. The InP substrate 21 was then placed in a preparatory chamber for specimen exchange, air therein was vacuumed by a vacuum pump, until a pressure of $10^{-3}$ Pa or less was obtained, and the InP substrate 21 was heated up to 100° C. to desorb residual moisture and an impurity gas.

Next, the InP substrate 21 was conveyed to a III-V dedicated growth chamber, and heated at a substrate temperature of 500° C. while a P molecular beam is applied to the surface of the InP substrate 21, thereby removing an oxide film formed on the surface of the InP substrate 21. After that, an n-type InP buffer layer 22 was grown to be 30 nm thick at the substrate temperature of 450° C., and an Si-doped n-type InGaAs buffered layer 53 was then grown to be 200 nm thick at the substrate temperature of 470° C.

Next, the specimen was conveyed to a II-VI dedicated growth chamber, and a Cl-doped n-type ZnCdSe low temperature buffered layer 54 was grown to be 5 nm thick at the substrate temperature of 200° C. while a Zn molecular beam is applied thereto. After that, a Cl-doped n-type ZnCdSe buffered layer 55 (having a thickness of 100 nm), a Cl-doped n-type MgZnCdSe cladding layer 47 (having a thickness of 800 nm), an MgZnCdSe barrier layer 48, a BeZnCdSe quantum well active layer 49 (having a thickness of 7.5 nm), and an MgZnCdSe barrier layer 48 were successively laminated. After that, a p-type cladding layer having an N-doped p-type superlattice structure was formed in which MgZnCdSe host layers 45 according to the present invention, and ZnTe specific layers 46 to be inserted were combined with each other. An N-doped p-type ZnSeTe/ZnTe contact layer 50 (having a total thickness of 500 nm) was then laminated, and finally an N-doped p-type ZnTe cap layer 30 (having a thickness of 30 nm) was laminated thereon. In this embodiment, each host layer 45 was made of MgZnCdSe (having a thickness of 4.0 nm), and each specific layer 46 was made of ZnTe (having a thickness of 1.0 nm). The MgZnCdSe/ZnTe superlattice structure was obtained in which the host layer 45 and the specific layer 46 were alternately laminated by 150 pairs.

FIG. 13B is an energy diagram showing an energy in a lamination direction obtained from the lamination structure shown in FIG. 13A.

A general procedure for forming individual optical semiconductor devices from an epitaxial wafer structured as described in FIGS. 13A and 13B will now be described with reference to FIGS. 14A to 14E, and FIGS. 15A to 15D.

Figure 14A:
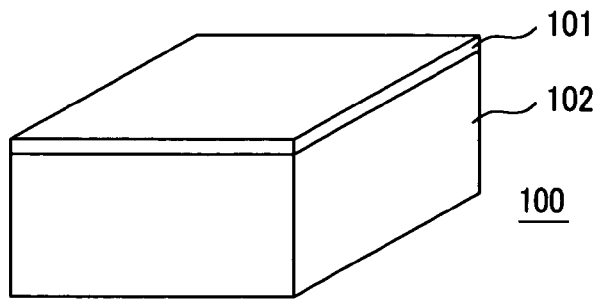

In FIG. 14A, reference numeral 100 designates an epitaxial wafer shown in FIGS. 13A and 13B. The epitaxial wafer 100 includes a light emitting portion 101 having a thickness of several micronmeters, and a base portion 102 having a thickness of several hundreds of micronmeters. A photo resist pattern (not shown) having a predetermined shape is formed on the p-type ZnTe cap layer 30 on the uppermost surface of the light emitting portion 101 to cover a portion other than a stripe portion and a current confinement area with the photo resist pattern. After that, for example, a Pd film, a Pt film, and an Au film are successively vacuum-evaporated on the overall surface. Thereafter, the photo resist pattern is lifted off together with the Pd film, the Pt film and the Au film which are formed on the photo resist pattern. As a result, a p-type electrode made of Pd/Pt/Au is formed on the ZnTe cap layer 30. After that, a heat treatment is performed if necessary, thereby making Ohmic contact.

Figure 14B:
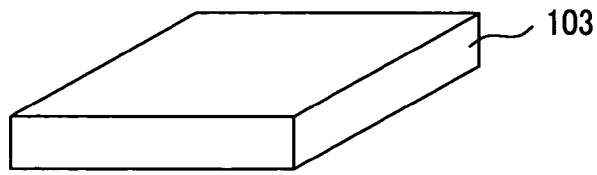

On the other hand, as shown in FIG. 14B, the n-type InP substrate of the base portion 102 is thinned to be about 100 μm thick, and an n-type electrode made of, for example, Au/Ge is vacuum-evaporated on the n-type InP substrate of the base portion 102 to obtain Ohmic contact between them. As a result, a wafer 103 is obtained, the wafer 103 having upper and lower surfaces on which the electrodes are formed.

Figure 14C:
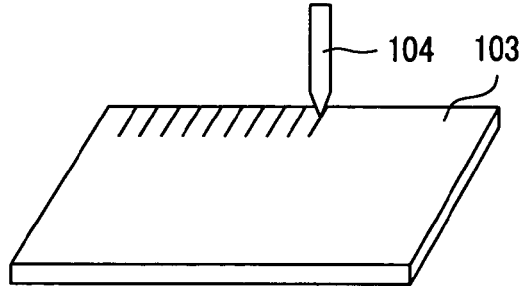
Figure 14D:
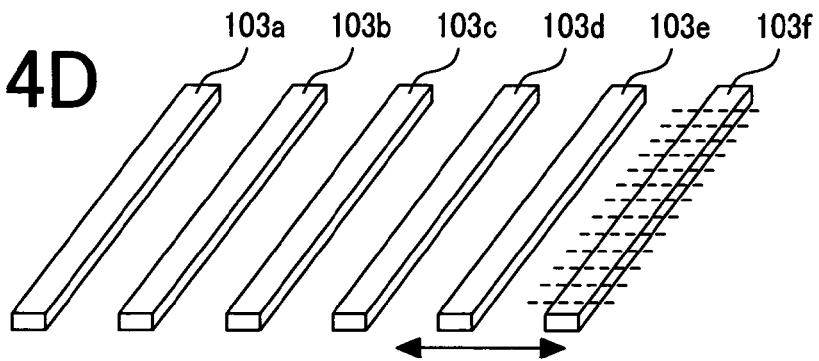
Figure 14E:
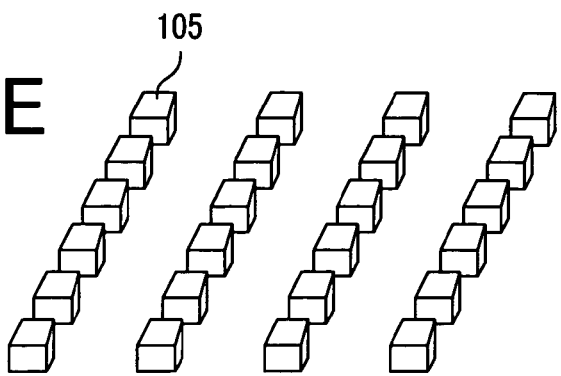

As shown in FIG. 14C, an end portion of the wafer 103 is scribed with a diamond cutter. Then, the wafer 103 is divided so as to open scratches while a pressure is applied thereto, thereby cleaving the wafer 103 into parts 103a, 103b, as shown by dotted lines in FIG. 14D. Next, a low reflection coating having a reflectivity of about 5%, and a high reflection coating having a reflectivity of about 95% are respectively formed on a front end face through which a light is emitted and a rear end face, respectively, using $Al_2O_3$, $SiO_x$, $SiN_x$ or the like through a vacuum evaporation or sputtering method. Next, a pelletizing process for scribing and dividing each part into a plurality of sub-parts as chips 105 in the stripe direction is performed to obtain the chips 105 as shown in FIG. 14E.

Figure 15A:
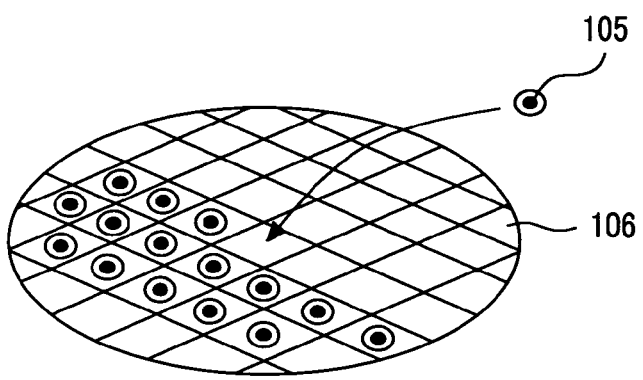
Figure 15B:
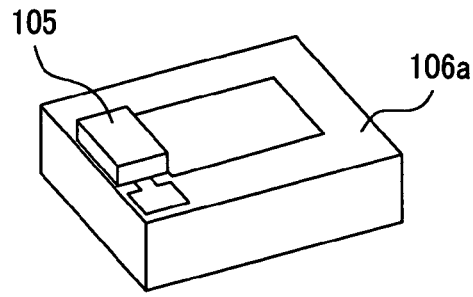
Figure 15C:
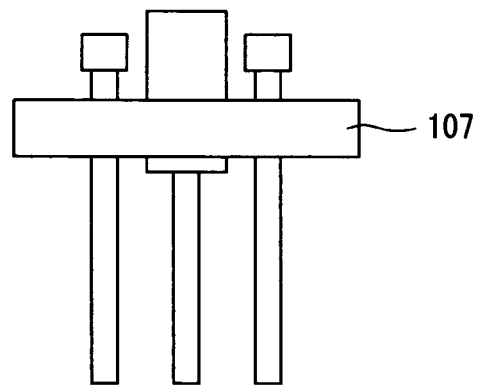
Figure 15D:
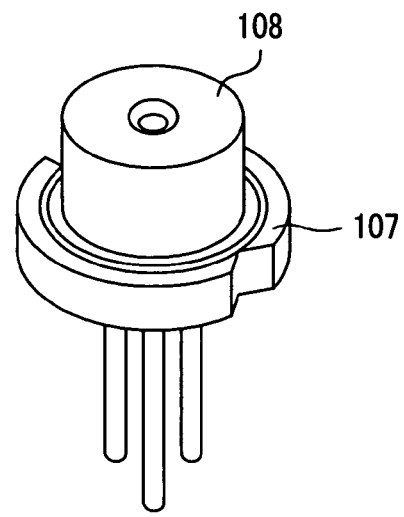

Next, as shown in FIG. 15A, the resulting chips 105 are disposed on a Si sub-mount 106 while adjusting positions of light emitting points and angles of the end faces. The chips 105 are fixedly mounted to the Si sub-mount 106 through an alloy process for applying solder between the chips 105 and the Si sub-mount 106 and heating the solder to melt the solder. As shown in FIG. 15B, the Si wafer is cut and separated into parts 106a by using a dicer. Next, a die bonding process for joining the part 106a to a heat sink stem 107 made of copper or the like is performed, and the part 106e is fixed to the heat sink stem 107 through a heating process using solder or an adhesive agent. As shown in FIG. 15C, a wire bonding process is performed for connecting electrodes on the chip 105 with terminals on the heat sink stem 107 through Au wires. As shown in FIG. 15D, a hermetically sealing process is performed for hermetically sealing the heat sink stem 107 with a window cap 108 which is an outlet for a laser beam, thereby completing a final package.

It should be noted that although the present invention has been concretely described based on the first to fourth embodiments so far, the present invention is not intended to be limited to these embodiments, and the various changes thereof based on the technical idea of the present invention may be made.

For example, the numeric values, the structures, the substrate raw materials, the processes and the like which have been given in the above-mentioned embodiments are merely examples. Thus, numeric values, structures, substrates, raw materials, processes and the like which are different from those thus exemplified may also be employed as may be necessary.

Specifically, although the three kinds of host layers made of ZnCdSe, MgSe/ZnCdSe, and MgZnCdSe, respectively, have been given in the above-mentioned embodiments, any of $Mg_xZn_yCd_{1-x-y}Se$, $Be_uZn_vCd_{1-u-v}Se$, $Mg_aZn_{1-a}Se_bTe_{1-b}$, and $Be_cZn_{1-c}Se_dTe_{1-d}$ (0<x, y, u, v, a, b, c, and d<1) may also be employed.

Additionally, the host layer made in the form of the superlattice structure may be made of any of MgSe/ZnCdSe, MgSe/ZnSeTe, MgSe/BeZnCdSe, MgSe/BeZnSeTe, MgZnBeTeSe/ZnCdSe, MgZnBeTeSe/ZnSeTe, MgZnBeTeSe/BeZnCdSe and MgZnBeTeSe/BeZnSeTe.

Additionally, a material which contains therein simultaneously S as a group VI atom and Cd as a group II atom is contained in the host layer.

Additionally, although ZnTe and ZnSeTe have been mainly given as the compound semiconductor materials for the specific layer in the above-mentioned embodiments, the specific layer may also be made of any of ZnTe, $ZnSe_fTe_{1-f}$, $Be_gZn_{1-g}Te$, $Mg_pZn_{1-p}Se_qTe_{1-q}$, and BeTe (0<f, g, p, and q<1).

Additionally, although 0.73 nm has been given as the thickness of the specific layer in the case of ZnTe in the above-mentioned embodiments, the thickness may also be adopted as long as it is equal to or larger than 2 ML, i.e., equal to or larger than 0.61 nm in the case of ZnTe.

Additionally, although no description has been given with respect to the growth shape of the specific layer made of ZnTe in the above-mentioned embodiments, either a layer growth or a dot-like (island) growth may also be available.

Additionally, the present invention includes the feature that the carrier concentration increases by one digit or more as compared with the case of the single host layer (in the case without any of the specific semiconductor layers).

Additionally, the present invention includes the feature that the carrier concentration of $1 \times 10^{17}$ cm$^{-3}$ or more is obtained in the compound semiconductor layer including mainly the group II atom and the group VI atom and having the energy gap Eg>2.9 eV.

Additionally, the present invention includes the feature that the dopant activation rate of 5% or more is obtained in the compound semiconductor layer including mainly the group II and VI atoms and having the energy gap Eg>2.9 eV.

Additionally, although the dopant is introduced into both the host layer and the specific layer in the above-mentioned embodiments in order to obtain the desired carrier concentration in the host layer, a method of introducing the dopant into only one of them may also be adopted.

Additionally, the present invention includes the feature that, when the strain is generated in the semiconductor layer due to any of the specific layers inserted between the host layers, the lattice from the substrate of the semiconductor layer is intentionally shifted, thereby compensating for the strain of the overall semiconductor layer.

Additionally, the description has been given based on the above-mentioned embodiments with respect to the structure in which each specific semiconductor layer is inserted between the host layers on the semiconductor substrate made of InP in order to obtain the desired carrier concentration in each host layer. However, the substrate may also be made of any of GaAs, GaP, ZnSe, ZnTe, Si, Ge, sapphire, GaN, SiC and the like.

Additionally, although the semiconductor LD has been given as the light emitting element in the above-mentioned embodiments, the light emitting diode and the PD as the photo-detecting device are also included in the light emitting element.

What is claimed is:

1. An optical semiconductor device, comprising an n-type cladding layer, an active layer and a p-type cladding layer on an InP substrate, wherein said p-type cladding layer has a superlattice structure comprising plural first layers and plural second layers alternately laminated;

each of said first layers employs MgZnCdSe, each of said second layers employs ZnTe;

a p-type carrier concentration of the p-type cladding layer having said first layers and said second layers is equal to or larger than $1 \times 10^{17}$ cm$^{-3}$, and is equal to or smaller than $1 \times 10^{22}$ cm$^{-3}$; and a layer thickness of each of said first layers is larger than that of each of said second layers, and a band gap width of each of said first layers is larger than that of each of said second layers.

* * * * *